(12) United States Patent
Da Silveira et al.

(10) Patent No.: US 12,388,201 B2
(45) Date of Patent: Aug. 12, 2025

(54) LOW PIM COAX TO PCB INTERFACE AND METHOD OF CONSTRUCTING THE SAME

(71) Applicant: Telefonaktiebolaget LM Ericsson (publ), Stockholm (SE)

(72) Inventors: Martin Da Silveira, Ottawa (CA); Neil McGowan, Stittsville (CA); Francis Marion, Gatineau (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 592 days.

(21) Appl. No.: 17/791,975

(22) PCT Filed: Jan. 21, 2021

(86) PCT No.: PCT/IB2021/050473
§ 371 (c)(1),
(2) Date: Jul. 11, 2022

(87) PCT Pub. No.: WO2021/148987
PCT Pub. Date: Jul. 29, 2021

(65) Prior Publication Data
US 2023/0058023 A1 Feb. 23, 2023

Related U.S. Application Data

(60) Provisional application No. 62/963,635, filed on Jan. 21, 2020.

(51) Int. Cl.
*H01R 9/05* (2006.01)
*H05K 1/02* (2006.01)
*H05K 3/34* (2006.01)

(52) U.S. Cl.
CPC ......... *H01R 9/0515* (2013.01); *H05K 1/0215* (2013.01); *H05K 3/34* (2013.01)

(58) Field of Classification Search
CPC ............... H01R 9/0515; H05K 3/34; H05K 2201/09563; H05K 1/0216; H05K 1/0228
(Continued)

(56) References Cited

U.S. PATENT DOCUMENTS

| 6,541,711 B1 | 4/2003 | Dube et al. |
| 2016/0365684 A1 | 12/2016 | Li et al. |

(Continued)

FOREIGN PATENT DOCUMENTS

EP  0223071 A2  5/1987

OTHER PUBLICATIONS

International Search Report and Written Opinion dated May 6, 2021 issued in PCT Application No. PCT/IB2021/050473, consisting of 15 pages.

*Primary Examiner* — Abdullah A Riyami
*Assistant Examiner* — Amara Anderson
(74) *Attorney, Agent, or Firm* — Weisberg I.P. Law, P.A.

(57) ABSTRACT

A low passive intermodulation (PIM) coaxial-to-printed circuit board (PCB) interface and method of constructing the same. According to one aspect, a coaxial-to-PCB interface couples signals between an electrical conductor trace in the PCB and an inner conductor of a coaxial structure having an insulator surrounded by an outer conductor. A metallic cylinder is inserted over the outer conductor of the coaxial structure and positioning the coaxial structure with respect to the PCB so that the outer conductor and insulator of the coaxial structure lie below a lower surface of the PCB. The inner conductor of the coaxial structure is inserted into a via extending from the lower surface of the PCB to an upper surface of the PCB. Solder is deposited in the via to provide an electrically conductive path between the electrical conductor trace of the PCB and the inner conductor of the coaxial structure.

20 Claims, 11 Drawing Sheets

(58) Field of Classification Search
USPC .................................................. 439/63, 55
See application file for complete search history.

(56) References Cited

U.S. PATENT DOCUMENTS

| | | | | |
|---|---|---|---|---|
| 2017/0290162 | A1* | 10/2017 | Gomez | H05K 1/0298 |
| 2017/0311449 | A1* | 10/2017 | Ohsawa | H05K 1/184 |
| 2019/0159333 | A1* | 5/2019 | Sinha | H05K 1/115 |

* cited by examiner

LOW PIM COAX TO PCB INTERFACE AND METHOD OF CONSTRUCTING THE SAME

CROSS-REFERENCE TO RELATED APPLICATIONS

This application is a Submission Under 35 U.S.C. § 371 for U.S. National Stage Patent Application of International Application No.: PCT/IB2021/050473, filed Jan. 21, 2021 entitled "LOW PIM COAX TO PCB INTERFACE," which claims priority to U. S. Provisional Application No.: 62/963,635, filed Jan. 21, 2020, entitled "LOW PIM COAX TO PCB INTERFACE," the entireties of both of which are incorporated herein by reference.

TECHNICAL FIELD

This disclosure relates to wireless communication and in particular, to a low passive intermodulation (PIM) coaxial to printed circuit board (PCB) interface.

BACKGROUND

There currently exist certain challenges to providing a coaxial-to-PCB interface. Typically, galvanic contact is required between connector signal pins and a PCB signal layer, and galvanic contact is required between connector ground pins and a PCB ground layer. The coaxial-to-PCB interface may generate passive intermodulation (PIM), which interferes with desired signals. Good low PIM connectors are expensive, large, difficult to use and/or unreliable or not available. Reliable soldered ground connections can be difficult to make, due to the high thermal conductivity of the material to be soldered. Cold solder joints can lead to greater PIM.

SUMMARY

Some embodiments advantageously provide a method and system for a low passive intermodulation (PIM) coaxial to printed circuit board (PCB) interface.

In some aspects, a ground contact between the connector and PCB is disclosed as being replaced by a capacitive coupling method. In some embodiments, the ground of the connector has a capacitive or metallic ring or cylinder (a large area typically in the shape of a ring, or less typically, another shape) that is placed in close proximity to the PCB ground. In some embodiments, isolation between the connector ground area and the PCB ground is achieved by the PCB solder mask or by a thin dielectric material such as capstan. In some embodiments, the center contact is made using a soldered pin. The PCB may be held against the capacitive cylinder through a spring force and the contact may be made such that the PCB can slide over the capacitive cylinder to allow for mismatches of coefficients of thermal expansion (CTEs) between the materials involved.

In some aspects, a coaxial structure, which may be an end of a coaxial cable, for example, is connected to a PCB in a way that is easy to implement, has low insertion loss and has very low PIM. This can be used in Fourth Generation (4G) and Fifth Generation (5G) radio systems to connect radio frequency (RF) modules together.

Some embodiments address one or more of the issues discussed herein. Certain embodiments may provide one or more of the following technical advantage(s):

There is no soldering required between connector ground pins and the PCB. This simplifies the assembly during production;

Very low PIM can be achieved, which is essential for frequency division duplex (FDD) applications; and/or The capacitive coupling of the ground around the center pin reduces the energy leaking from the coaxial connection to the point where traditional gaskets can be used without generating PIM.

According to one aspect, a coaxial-to-printed circuit board, PCB, interface is provided. The interface includes: a PCB having a first dielectric constant. The PCB has: a PCB lower ground plane on a lower surface of the PCB; a PCB upper ground plane on an upper surface of the PCB opposite the PCB lower surface; a PCB electrical conductor trace above the PCB lower ground plane and below the PCB upper ground plane; and a via extending from a lower surface of the PCB to an upper surface of the PCB. The interface also includes a coaxial structure having an outer conductor and an inner conductor, the coaxial structure terminating at an end, the inner conductor extending beyond an extent of the outer conductor at the end of the coaxial structure, the inner conductor being configured to be inserted into the via and being further configured to be soldered to the PCB electrical conductor trace by adding solder to the via, the PCB electrical conductor being configured to make electrical contact with solder added to the via. The interface further includes a metallic cylinder the metallic cylinder having a thickness and an outer perimeter, and being configured to at least partially surround the outer conductor and form a capacitive gap between the outer conductor of the coaxial structure and the PCB lower ground plane.

According to this aspect, in some embodiments, the interface further includes a solder mask on the lower surface of the PCB, wherein the metallic cylinder is separated from the PCB lower ground plane by the solder mask. In some embodiments, at least one of the thickness, a distance from the outer conductor of the coaxial structure to the outer perimeter of the metallic cylinder is selected to at least partially match a first impedance of the coaxial-to-PCB interface to a second impedance of the coaxial structure. In some embodiments, the PCB electrical conductor has a transition trace along a length extending away from the inner conductor of the coaxial structure. In some embodiments, the taper is selected to at least partially match the first impedance of the coaxial-to-PCB interface to a third impedance of the PCB electrical conductor trace. In some embodiments, the PCB electrical conductor trace has an end portion that at least partially surrounds the via. In some embodiments, the interface further includes a snorkel, the snorkel being a cavity, the snorkel extending from the PCB lower surface to the PCB upper surface. In some embodiments, the inner conductor of the coaxial structure extends to a location above the PCB upper surface. In some embodiments, the inner conductor of the coaxial structure is tapered at an end of the inner conductor. In some embodiments, the metallic cylinder, the outer conductor and the inner conductor of the coaxial structure are coaxial with respect to one another.

According to another aspect, a coaxial-to-PCB, interface includes a PCB comprising: a lower surface partially covered by a lower ground plane; an upper surface partially covered by an upper ground plane opposite the lower surface; a dielectric slab between the lower ground plane and the upper ground plane; a via extending through the dielectric slab from the lower surface to the upper surface; and an electrical conductor trace between the lower surface of the PCB and the upper surface of the PCB, the electrical conductor trace of the PCB being in electrical contact with solder deposited into the via. The interface also includes a coaxial structure that includes an outer conductor terminating below the lower ground plane of the PCB; and an inner conductor being inserted into the via before deposition of the solder, the inner conductor of the coaxial structure terminating above the lower ground plane of the PCB. The interface also includes a metallic cylinder below the lower ground plane of the PCB, the metallic cylinder being concentric with and exterior to the outer conductor of the coaxial structure when the inner conductor of the coaxial structure is inserted into the via.

According to this aspect, in some embodiments, the metallic cylinder has a circular cross section. In some embodiments, the interface further includes a solder mask on the lower surface of the PCB, wherein the metallic cylinder forms a capacitive ring that capacitively couples the lower ground plane of the PCB to the coaxial structure through the solder mask. In some embodiments, the metallic cylinder has a height and makes electrical contact with a PCB solder mask below the lower ground plane of the PCB. In some embodiments, the inner conductor of the coaxial structure passes through the via and extends above the upper ground plane of the PCB.

According to yet another aspect, a method is provided for constructing a coaxial-to-PCB interface to couple signals between an electrical conductor trace in a PCB and an inner conductor of a coaxial structure, the coaxial structure having an insulator surrounded by an outer conductor. The method includes: inserting a metallic cylinder over the outer conductor of the coaxial structure, and positioning the coaxial structure with respect to the PCB so that: the outer conductor and insulator of the coaxial structure lie below a lower surface of the PCB; and the inner conductor of the coaxial structure is inserted into a via extending from the lower surface of the PCB to an upper surface of the PCB. The method also includes depositing solder in the via to provide an electrically conductive path between the electrical conductor trace of the PCB and the inner conductor of the coaxial structure.

According to this aspect, in some embodiments, the positioning further includes causing the metallic cylinder to make contact with a solder mask on the lower surface of the PCB. In some embodiments, positioning the coaxial structure so that the inner conductor of the coaxial structure is inserted into the via includes inserting the inner conductor of the coaxial structure through an annular ring formed by the end portion of the electrical conductor trace. In some embodiments, the method further includes applying force to the PCB to maintain contact between a solder mask on an under side of the lower ground plane of the PCB and an upper end of the metallic cylinder. In some embodiments, the method further includes applying force to the PCB to maintain contact between an upper edge of the metallic cylinder and a solder mask on a lower side of the lower ground plane of the PCB.

BRIEF DESCRIPTION OF THE DRAWINGS

A more complete understanding of the present embodiments, and the attendant advantages and features thereof, will be more readily understood by reference to the following detailed description when considered in conjunction with the accompanying drawings wherein.

DETAILED DESCRIPTION

Figure 1:
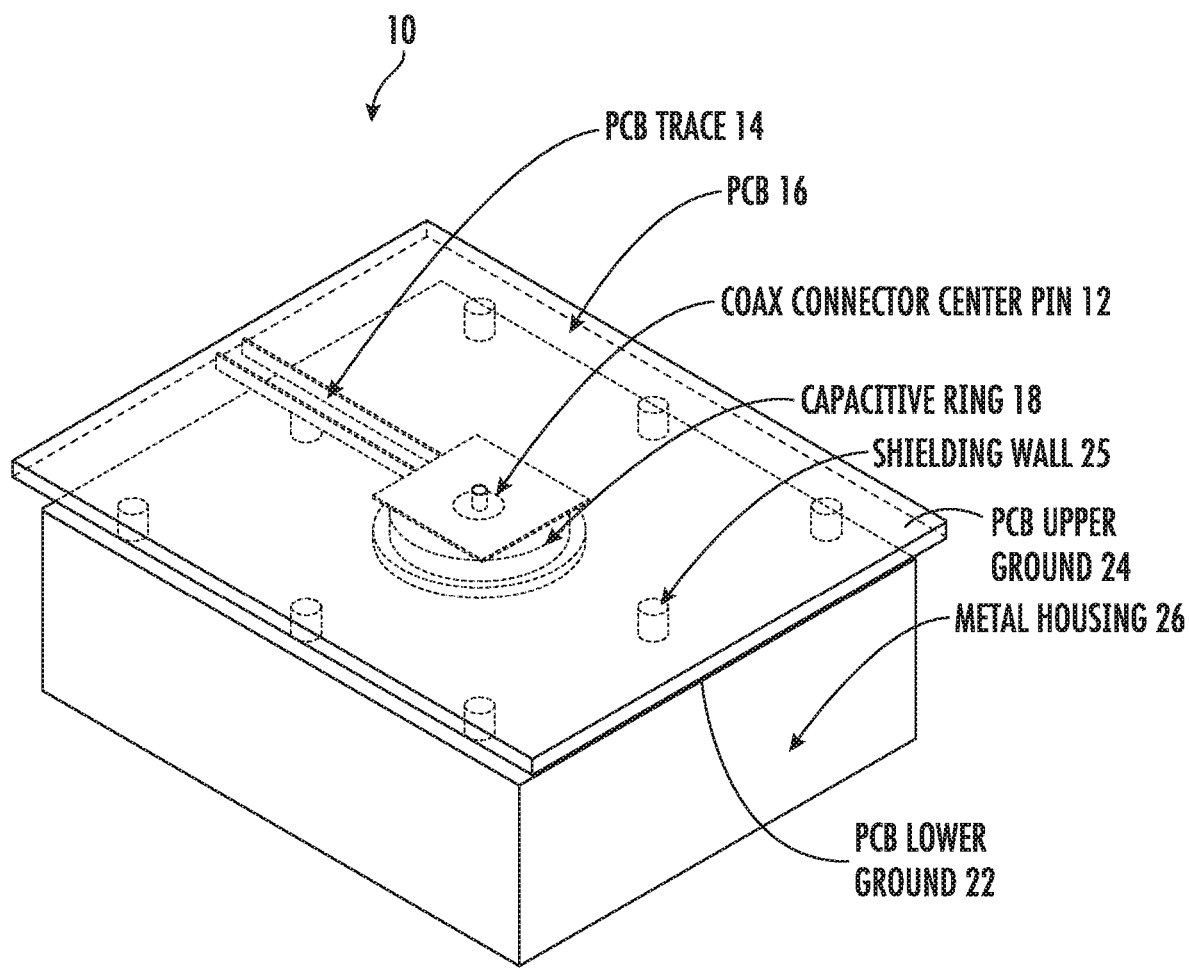
FIG. 1 is an example embodiment of a coaxial-to-PCB interface.

Before describing in detail exemplary embodiments, it is noted that the embodiments reside primarily in combinations of apparatus components and processing steps related to a low passive intermodulation (PIM) coaxial to printed circuit board (PCB) interface. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Some of the embodiments contemplated herein will now be described more fully with reference to the accompanying drawings. Other embodiments, however, are contained within the scope of the subject matter disclosed herein, the disclosed subject matter should not be construed as limited to only the embodiments set forth herein; rather, these embodiments are provided by way of example to convey the scope of the subject matter to those skilled in the art.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

In some embodiments, a low passive intermodulation (PIM) coaxial to printed circuit board (PCB) interface is provided.

Figure 2:
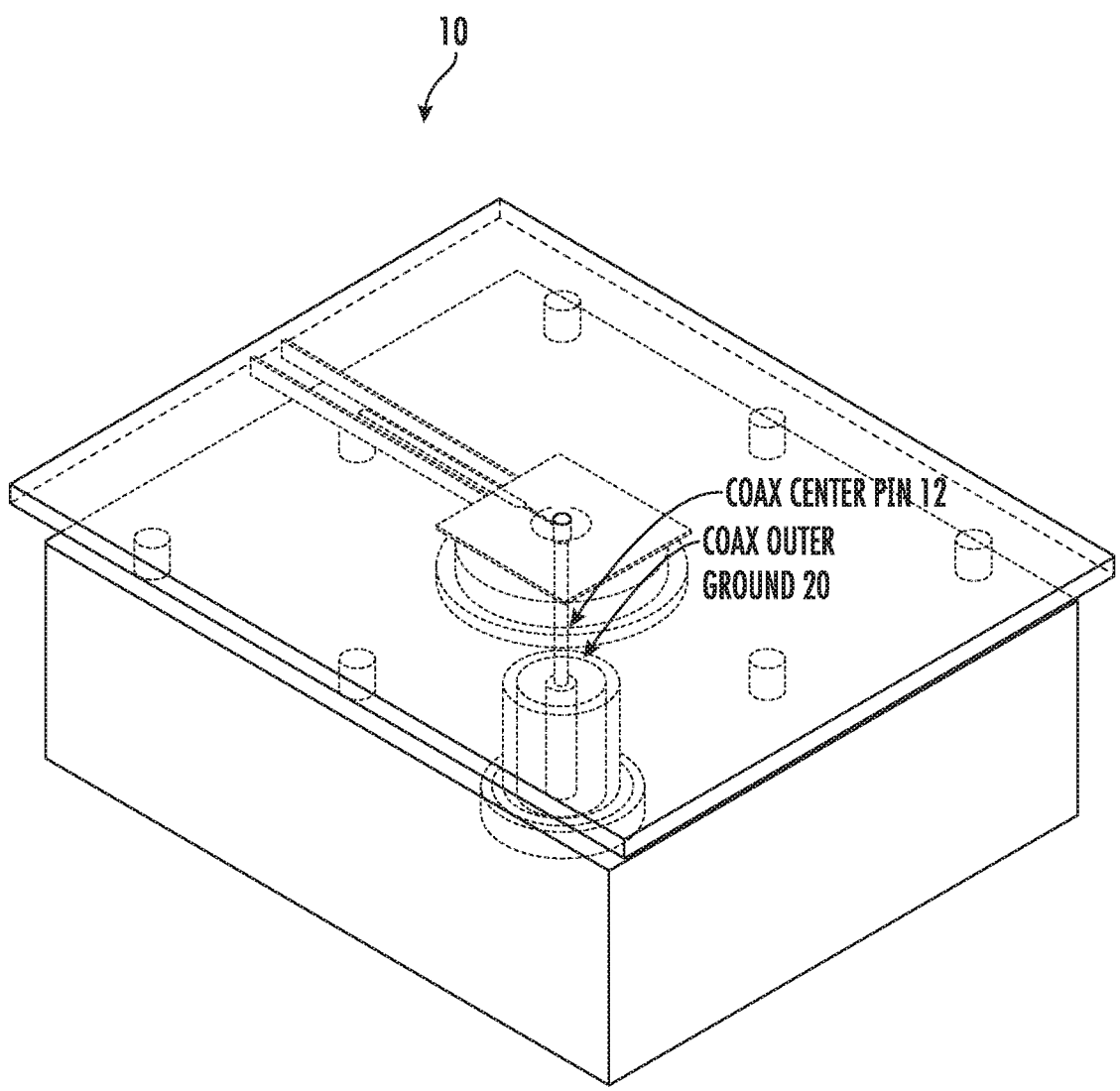
FIG. 2 is an alternative view of an example embodiment of a coaxial-to-PCB interface.

Referring now to the drawing figures, there is shown in FIGS. 1 and 2, an embodiment of a coaxial-to-interface. In this embodiment, a coaxial center pin 12 is connected to the PCB electrical conductor trace or transmission line 14. The coaxial center pin 12 is inserted into a via in the PCB 16 and then soldered. A metallic cylinder 18 couples a coaxial outer ground 20 (shown in FIG. 2) to a PCB lower ground plane 22, in this example. The PCB lower ground plane 22 is opposite the PCB upper ground plane 24. Vias are placed around the area of connection. The vias' heights may extend from the top PCB ground layer level to the bottom PCB ground layer level. The vias form the shielding wall 25 to keep the field from leaking to the rest of the PCB and cause resonant modes as well couple to other ports. The shielding wall 25 reduces energy leakage from the gap between the PCB lower ground plane 22 and the capacitive/metallic cylinder 18 (metallic cylinder 18, ground coupling ring 18 and capacitive ring 18, are all generally the same and are interchangeably referred to herein). The PCB 16 can be mounted on a metal chassis 26 and the metal chassis 26 may then form the ground for the capacitive ring 18 as well as the coaxial structure having the coaxial center pin 12 and coaxial outer ground 20.

Figure 3:
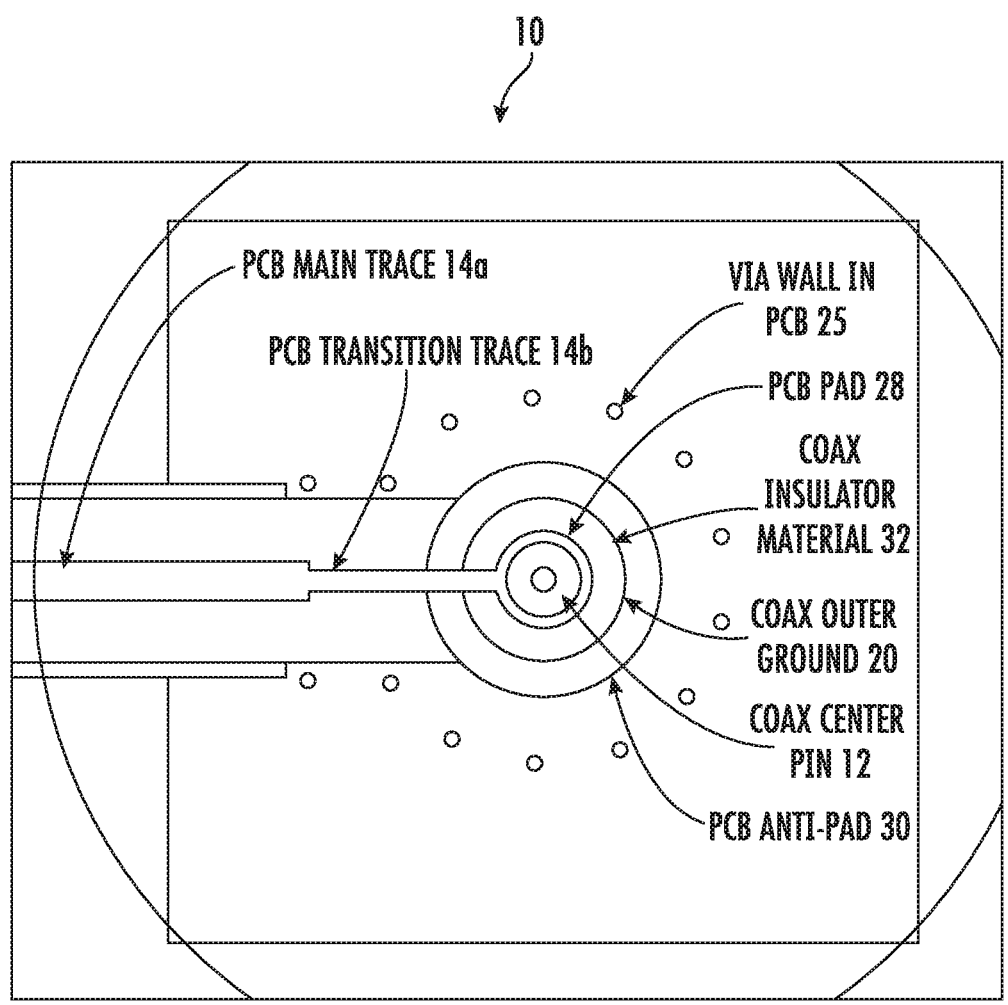
FIG. 3 illustrates a top view of a PCB trace and coaxial structure configured according to principles set forth herein.

FIG. 2 illustrates the coaxial center pin 12 and the coaxial outer ground 20. FIG. 3 shows further detail of the coaxial-to-interface. FIG. 3 shows a PCB electrical conductor trace 14 having a PCB main trace 14a and a PCB transition trace 14b. The PCB transition trace 14b terminates in a PCB pad 28 that is shown as a conductive ring around the coaxial center pin 12.

A center via is also created at the end of the PCB transition trace 14b with PCB pads 28 on all layers. The coaxial center pin 12, which extends through the PCB pads 28, is soldered to the PCB pads 28. A PCB anti-pad 30 is inserted on the ground layers to form a clearance between the PCB pads 28 and the ground. The size of the PCB anti-pad 30 may be as small as possible, in some embodiments, to prevent the field from radiating out and away from the connection. Matching between the PCB electrical conductor trace 14 and the coaxial input may be achieved by varying the sizes of the PCB pads and/or anti-pads, varying the distance to via shielding wall 25 and/or varying the PCB transition trace width (the change in width between PCB main trace 14a and the PCB transition trace(s) 14b.

Figure 4:
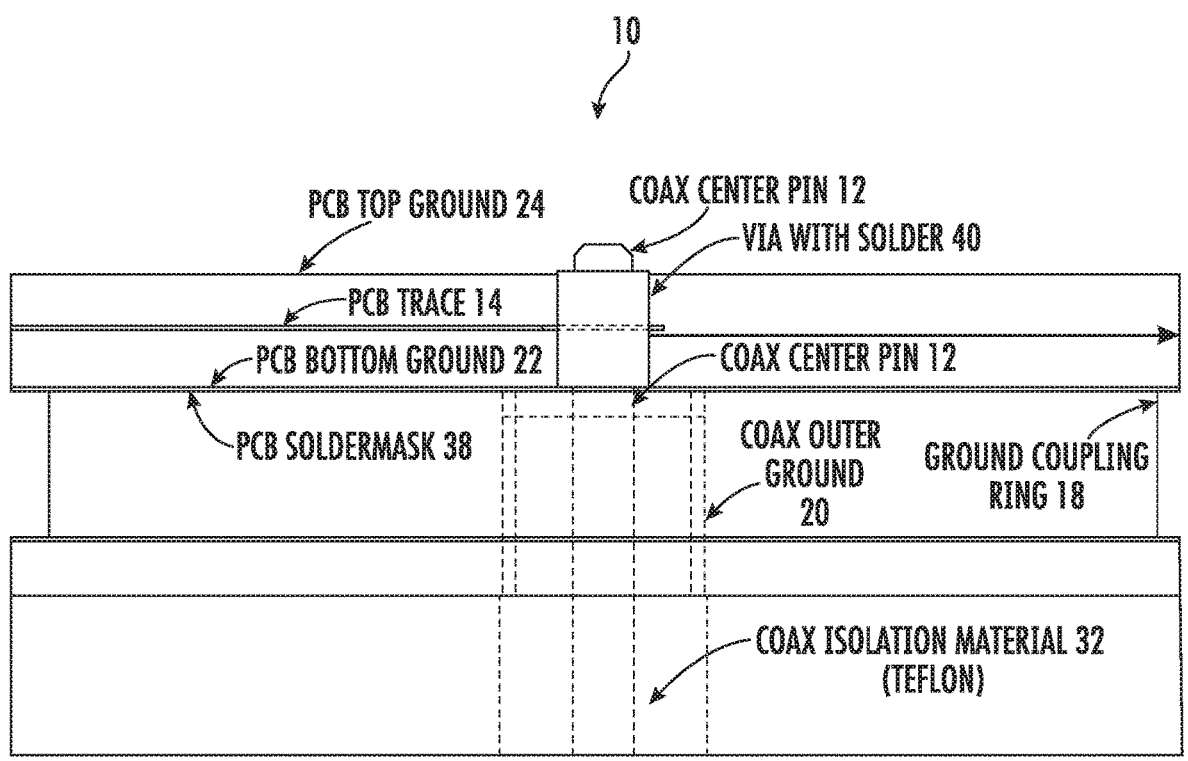
FIG. 4 is a side view of an example of a coaxial-to-PCB interface configured according to principles set forth herein.

FIG. 4 is a side view of an embodiment of the coaxial-to-PCB interface 10. A ground coupling ring 18 is shown below a bottom ground 36 and PCB solder mask 38. The ground coupling ring 18 may be a metallic cylinder, such as the capacitive ring 18 shown in FIG. 1. The cross sectional shape of the metallic cylinder referred to herein could be a ring, as shown in FIGS. 1-5, or could have some other cross section. The ground coupling ring 18 is separated on its upper side from the bottom or lower ground plane 22 of the PCB 16 by the PCB solder mask 38, as well as by deviations from specifications within machine tolerances. The diameter of the ground coupling ring 18 must be large enough to achieve good coupling between the PCB lower or bottom ground plane 22 and the coaxial outer ground 20. As an example, a ground coupling ring diameter of 19 mm and solder mask thickness of 35 um will give an insertion loss of less than 0.02 dB, in some embodiments.

FIG. 4 also shows the center via 40 filled with solder and the coaxial center pin 12 (also referred to herein as inner conductor 12) protruding through the center via 40. Note that the solder in the center via 40 is electrically isolated from the PCB top or upper ground plane 24 and the PCB lower ground plane 22 by, for example, etching away a circle in the top and bottom ground planes to form PCB anti-pads 30. In FIG. 4, the coaxial center pin 12, the coaxial isolation material or insulator 32, and the coaxial outer ground 20 form a coaxial structure. The insulator 32 may be made of a suitable dielectric such as teflon.

Figure 5:
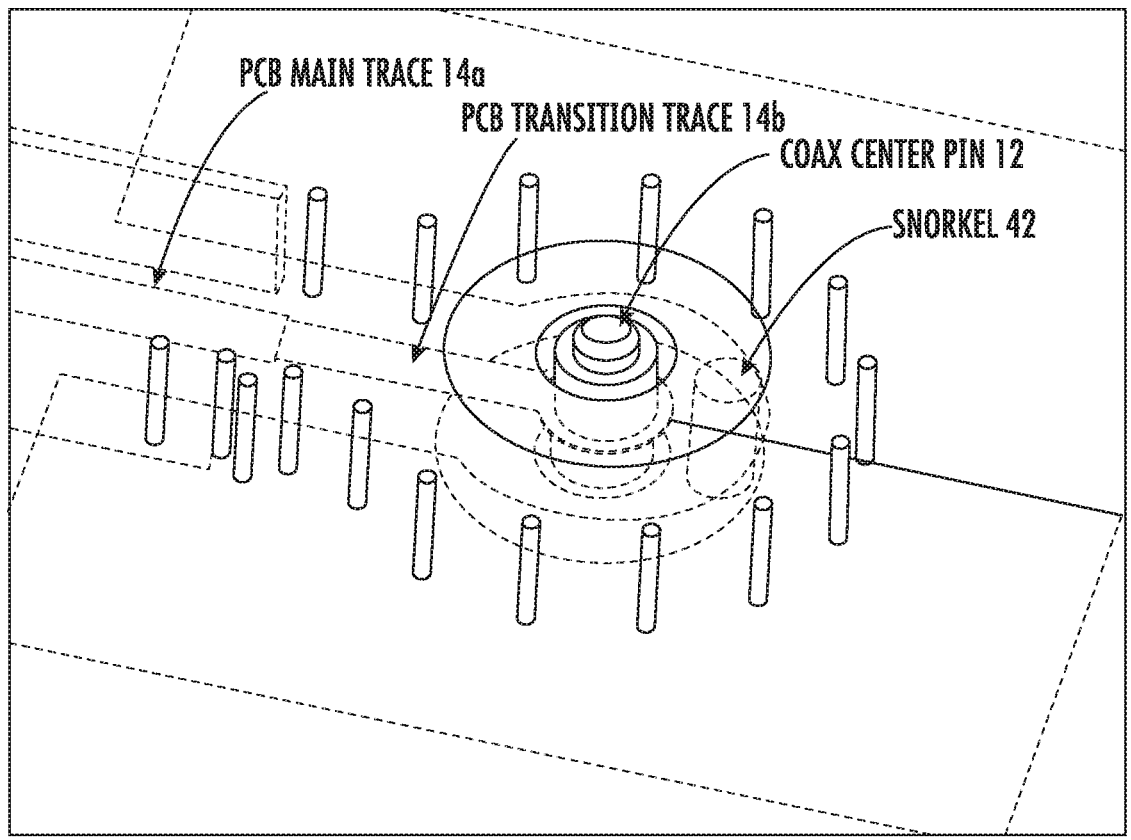
FIG. 5 illustrates an example of a coaxial-to-PCB interface that includes a snorkel.

FIG. 5 is an embodiment of the coaxial-to-PCB interface 10 that includes a snorkel structure 42 which is an empty cylinder, for example, to prevent a vacuum forming below the PCB and causing soldering problems that could lead to PIM degradation.

Figure 6:
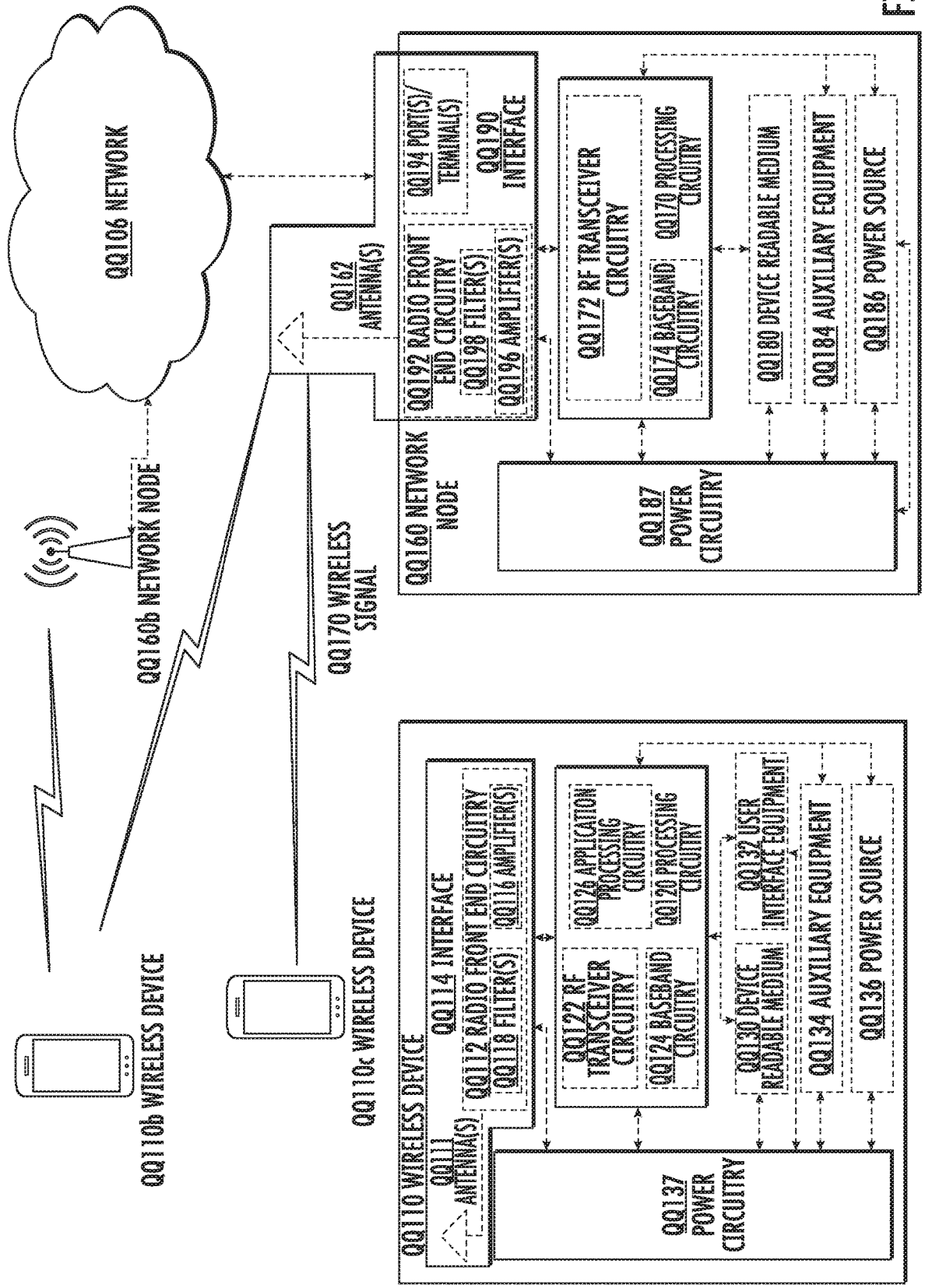
FIG. 6 is an example wireless network which may be configured to employ the coaxial-to-PCB interface.

Although the subject matter described herein may be implemented in any appropriate type of system using any suitable components, the embodiments disclosed herein are described in relation to a wireless network, such as the example wireless network illustrated in FIG. 6. For simplicity, the wireless network of FIG. 6 only depicts network QQ106, network nodes QQ160 and QQ160b, and WDs QQ110, QQ110b, and QQ110c. In practice, a wireless network may further include any additional elements suitable to support communication between wireless devices or between a wireless device and another communication device, such as a landline telephone, a service provider, or any other network node or end device. Of the illustrated components, network node QQ160 and wireless device (WD) QQ110 are depicted with additional detail. The wireless network may provide communication and other types of services to one or more wireless devices to facilitate the wireless devices' access to and/or use of the services provided by, or via, the wireless network.

The wireless network may comprise and/or interface with any type of communication, telecommunication, data, cellular, and/or radio network or other similar type of system. In some embodiments, the wireless network may be configured to operate according to specific standards or other types of predefined rules or procedures. Thus, particular embodiments of the wireless network may implement communication standards, such as Global System for Mobile Communications (GSM), Universal Mobile Telecommunications System (UMTS), Long Term Evolution (LTE), and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, Z-Wave and/or ZigBee standards.

Network QQ106 may comprise one or more backhaul networks, core networks, IP networks, public switched telephone networks (PSTNs), packet data networks, optical networks, wide-area networks (WANs), local area networks (LANs), wireless local area networks (WLANs), wired networks, wireless networks, metropolitan area networks, and other networks to enable communication between devices.

Network node QQ160 and WD QQ110 comprise various components described in more detail below. These components work together in order to provide network node and/or wireless device functionality, such as providing wireless connections in a wireless network. In different embodiments, the wireless network may comprise any number of wired or wireless networks, network nodes, base stations, controllers, wireless devices, relay stations, and/or any other components or systems that may facilitate or participate in the communication of data and/or signals whether via wired or wireless connections.

As used herein, network node refers to equipment capable, configured, arranged and/or operable to communicate directly or indirectly with a wireless device and/or with other network nodes or equipment in the wireless network to enable and/or provide wireless access to the wireless device and/or to perform other functions (e.g., administration) in the wireless network. Examples of network nodes include, but are not limited to, access points (APs) (e.g., radio access points), base stations (BSs) (e.g., radio base stations, Node Bs, evolved Node Bs (eNBs) and NR NodeBs (gNBs)). Base stations may be categorized based on the amount of coverage they provide (or, stated differently, their transmit power level) and may then also be referred to as femto base stations, pico base stations, micro base stations, or macro base stations. A base station may be a relay node or a relay donor node controlling a relay. A network node may also include one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base station may also be referred to as nodes in a distributed antenna system (DAS). Yet further examples of network nodes include multi-standard radio (MSR) equipment such as MSR BSs, network controllers such as radio network controllers (RNCs) or base station controllers (BSCs), base transceiver stations (BTSs), transmission points, transmission nodes, multi-cell/multicast coordination entities (MCEs), core network nodes (e.g., MSCs, MMEs), O&M nodes, OSS nodes, SON nodes, positioning nodes (e.g., E-SMLCs), and/or MDTs. As another example, a network node may be a virtual network node as described in more detail below. More generally, however, network nodes may represent any suitable device (or group of devices) capable, configured, arranged, and/or operable to enable and/or provide a wireless device with access to the wireless network or to provide some service to a wireless device that has accessed the wireless network.

In FIG. 6, network node QQ160 includes processing circuitry QQ170, device readable medium QQ180, interface QQ190, auxiliary equipment QQ184, power source QQ186, power circuitry QQ187, and antenna QQ162. Although network node QQ160 illustrated in the example wireless network of FIG. 6 may represent a device that includes the illustrated combination of hardware components, other embodiments may comprise network nodes with different combinations of components. It is to be understood that a network node comprises any suitable combination of hardware and/or software needed to perform the tasks, features, functions and methods disclosed herein. Moreover, while the components of network node QQ160 are depicted as single boxes located within a larger box, or nested within multiple boxes, in practice, a network node may comprise multiple different physical components that make up a single illustrated component (e.g., device readable medium QQ180 may comprise multiple separate hard drives as well as multiple RAM modules).

Similarly, network node QQ160 may be composed of multiple physically separate components (e.g., a NodeB component and a RNC component, or a BTS component and a BSC component, etc.), which may each have their own respective components. In certain scenarios in which network node QQ160 comprises multiple separate components (e.g., BTS and BSC components), one or more of the separate components may be shared among several network nodes. For example, a single RNC may control multiple NodeB's. In such a scenario, each unique NodeB and RNC pair, may in some instances be considered a single separate network node. In some embodiments, network node QQ160 may be configured to support multiple radio access technologies (RATs). In such embodiments, some components may be duplicated (e.g., separate device readable medium QQ180 for the different RATs) and some components may be reused (e.g., the same antenna QQ162 may be shared by the RATs). Network node QQ160 may also include multiple sets of the various illustrated components for different wireless technologies integrated into network node QQ160, such as, for example, GSM, WCDMA, LTE, NR, WiFi, or Bluetooth wireless technologies. These wireless technologies may be integrated into the same or different chip or set of chips and other components within network node QQ160.

Processing circuitry QQ170 is configured to perform any determining, calculating, or similar operations (e.g., certain obtaining operations) described herein as being provided by a network node. These operations performed by processing circuitry QQ170 may include processing information obtained by processing circuitry QQ170 by, for example, converting the obtained information into other information, comparing the obtained information or converted information to information stored in the network node, and/or performing one or more operations based on the obtained information or converted information, and as a result of said processing making a determination.

Processing circuitry QQ170 may comprise a combination of one or more of a microprocessor, controller, microcontroller, central processing unit, digital signal processor, application-specific integrated circuit, field programmable gate array, or any other suitable computing device, resource, or combination of hardware, software and/or encoded logic operable to provide, either alone or in conjunction with other network node QQ160 components, such as device readable medium QQ180, network node QQ160 functionality. For example, processing circuitry QQ170 may execute instructions stored in device readable medium QQ180 or in memory within processing circuitry QQ170. Such functionality may include providing any of the various wireless features, functions, or benefits discussed herein. In some embodiments, processing circuitry QQ170 may include a system on a chip (SOC).

In some embodiments, processing circuitry QQ170 may include one or more of radio frequency (RF) transceiver circuitry QQ172 and baseband processing circuitry QQ174. In some embodiments, radio frequency (RF) transceiver circuitry QQ172 and baseband processing circuitry QQ174 may be on separate chips (or sets of chips), boards, or units, such as radio units and digital units. In alternative embodiments, part or all of RF transceiver circuitry QQ172 and baseband processing circuitry QQ174 may be on the same chip or set of chips, boards, or units In certain embodiments, some or all of the functionality described herein as being provided by a network node, base station, eNB or other such network device may be performed by processing circuitry QQ170 executing instructions stored on device readable medium QQ180 or memory within processing circuitry QQ170. In alternative embodiments, some or all of the functionality may be provided by processing circuitry QQ170 without executing instructions stored on a separate or discrete device readable medium, such as in a hard-wired manner. In any of those embodiments, whether executing instructions stored on a device readable storage medium or not, processing circuitry QQ170 can be configured to perform the described functionality. The benefits provided by such functionality are not limited to processing circuitry QQ170 alone or to other components of network node QQ160, but are enjoyed by network node QQ160 as a whole, and/or by end users and the wireless network generally.

Device readable medium QQ180 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used by processing circuitry QQ170. Device readable medium QQ180 may store any suitable instructions, data or information, including a computer program, software, an application including one or more of logic, rules, code, tables, etc. and/or other instructions capable of being executed by processing circuitry QQ170 and, utilized by network node QQ160. Device readable medium QQ180 may be used to store any calculations made by processing circuitry QQ170 and/or any data received via interface QQ190. In some embodiments, processing circuitry QQ170 and device readable medium QQ180 may be considered to be integrated.

Interface QQ190 is used in the wired or wireless communication of signaling and/or data between network node QQ160, network QQ106, and/or WDs QQ110. As illustrated, interface QQ190 comprises port(s)/terminal(s) QQ194 to send and receive data, for example to and from network QQ106 over a wired connection. Interface QQ190 also includes radio front end circuitry QQ192 that may be coupled to, or in certain embodiments a part of, antenna QQ162. Radio front end circuitry QQ192 comprises filters QQ198 and amplifiers QQ196. Radio front end circuitry QQ192 may be connected to antenna QQ162 and processing circuitry QQ170. Radio front end circuitry may be configured to condition signals communicated between antenna QQ162 and processing circuitry QQ170. Radio front end circuitry QQ192 may receive digital data that is to be sent out to other network nodes or WDs via a wireless connection. Radio front end circuitry QQ192 may convert the digital data into a radio signal having the appropriate channel and bandwidth parameters using a combination of filters QQ198 and/or amplifiers QQ196. The radio signal may then be transmitted via antenna QQ162. Similarly, when receiving data, antenna QQ162 may collect radio signals which are then converted into digital data by radio front end circuitry QQ192. The digital data may be passed to processing circuitry QQ170. In other embodiments, the interface may comprise different components and/or different combinations of components.

In certain alternative embodiments, network node QQ160 may not include separate radio front end circuitry QQ192, instead, processing circuitry QQ170 may comprise radio front end circuitry and may be connected to antenna QQ162 without separate radio front end circuitry QQ192. Similarly, in some embodiments, all or some of RF transceiver circuitry QQ172 may be considered a part of interface QQ190. In still other embodiments, interface QQ190 may include one or more ports or terminals QQ194, radio front end circuitry QQ192, and RF transceiver circuitry QQ172, as part of a radio unit (not shown), and interface QQ190 may communicate with baseband processing circuitry QQ174, which is part of a digital unit (not shown).

Antenna QQ162 may include one or more antennas, or antenna arrays, configured to send and/or receive wireless signals. Antenna QQ162 may be coupled to radio front end circuitry QQ190 and may be any type of antenna capable of transmitting and receiving data and/or signals wirelessly. In some embodiments, antenna QQ162 may comprise one or more omni-directional, sector or panel antennas operable to transmit/receive radio signals between, for example, 2 GHz and 66 GHz. An omni-directional antenna may be used to transmit/receive radio signals in any direction, a sector antenna may be used to transmit/receive radio signals from devices within a particular area, and a panel antenna may be a line of sight antenna used to transmit/receive radio signals in a relatively straight line. In some instances, the use of more than one antenna may be referred to as MIMO. In certain embodiments, antenna QQ162 may be separate from network node QQ160 and may be connectable to network node QQ160 through an interface or port.

Antenna QQ162, interface QQ190, and/or processing circuitry QQ170 may be configured to perform any receiving operations and/or certain obtaining operations described herein as being performed by a network node. Any information, data and/or signals may be received from a wireless device, another network node and/or any other network equipment. Similarly, antenna QQ162, interface QQ190, and/or processing circuitry QQ170 may be configured to perform any transmitting operations described herein as being performed by a network node. Any information, data and/or signals may be transmitted to a wireless device, another network node and/or any other network equipment.

Power circuitry QQ187 may comprise, or be coupled to, power management circuitry and is configured to supply the components of network node QQ160 with power for performing the functionality described herein. Power circuitry QQ187 may receive power from power source QQ186. Power source QQ186 and/or power circuitry QQ187 may be configured to provide power to the various components of network node QQ160 in a form suitable for the respective components (e.g., at a voltage and current level needed for each respective component). Power source QQ186 may either be included in, or external to, power circuitry QQ187 and/or network node QQ160. For example, network node QQ160 may be connectable to an external power source (e.g., an electricity outlet) via an input circuitry or interface such as an electrical cable, whereby the external power source supplies power to power circuitry QQ187. As a further example, power source QQ186 may comprise a source of power in the form of a battery or battery pack which is connected to, or integrated in, power circuitry QQ187. The battery may provide backup power should the external power source fail. Other types of power sources, such as photovoltaic devices, may also be used.

Alternative embodiments of network node QQ160 may include additional components beyond those shown in FIG. 6 that may be responsible for providing certain aspects of the network node's functionality, including any of the functionality described herein and/or any functionality necessary to support the subject matter described herein. For example, network node QQ160 may include user interface equipment to allow input of information into network node QQ160 and to allow output of information from network node QQ160. This may allow a user to perform diagnostic, maintenance, repair, and other administrative functions for network node QQ160.

As used herein, wireless device (WD) refers to a device capable, configured, arranged and/or operable to communicate wirelessly with network nodes and/or other wireless devices. Unless otherwise noted, the term WD may be used interchangeably herein with user equipment (UE). Communicating wirelessly may involve transmitting and/or receiving wireless signals using electromagnetic waves, radio waves, infrared waves, and/or other types of signals suitable for conveying information through air. In some embodiments, a WD may be configured to transmit and/or receive information without direct human interaction. For instance, a WD may be designed to transmit information to a network on a predetermined schedule, when triggered by an internal or external event, or in response to requests from the network. Examples of a WD include, but are not limited to, a smart phone, a mobile phone, a cell phone, a voice over IP (VoIP) phone, a wireless local loop phone, a desktop computer, a personal digital assistant (PDA), a wireless cameras, a gaming console or device, a music storage device, a playback appliance, a wearable terminal device, a wireless endpoint, a mobile station, a tablet, a laptop, a laptop-embedded equipment (LEE), a laptop-mounted equipment (LME), a smart device, a wireless customer-premise equipment (CPE). a vehicle-mounted wireless terminal device, etc. A WD may support device-to-device (D2D) communication, for example by implementing a 3GPP standard for sidelink communication, vehicle-to-vehicle (V2V), vehicle-to-infrastructure (V2I), vehicle-to-everything (V2X) and may in this case be referred to as a D2D communication device. As yet another specific example, in an Internet of Things (IoT) scenario, a WD may represent a machine or other device that performs monitoring and/or measurements, and transmits the results of such monitoring and/or measurements to another WD and/or a network node. The WD may in this case be a machine-to-machine (M2M) device, which may in a 3GPP context be referred to as an MTC device. As one particular example, the WD may be a WD implementing the 3GPP narrow band internet of things (NB-IoT) standard. Particular examples of such machines or devices are sensors, metering devices such as power meters, industrial machinery, or home or personal appliances (e.g. refrigerators, televisions, etc.) personal wearables (e.g., watches, fitness trackers, etc.). In other scenarios, a WD may represent a vehicle or other equipment that is capable of monitoring and/or reporting on its operational status or other functions associated with its operation. A WD as described above may represent the endpoint of a wireless connection, in which case the device may be referred to as a wireless terminal. Furthermore, a WD as described above may be mobile, in which case it may also be referred to as a mobile device or a mobile terminal.

As illustrated, wireless device QQ110 includes antenna QQ111, interface QQ114, processing circuitry QQ120, device readable medium QQ130, user interface equipment QQ132, auxiliary equipment QQ134, power source QQ136 and power circuitry QQ137. WD QQ110 may include multiple sets of one or more of the illustrated components for different wireless technologies supported by WD QQ110, such as, for example, GSM, WCDMA, LTE, NR, WiFi, WiMAX, or Bluetooth wireless technologies, just to mention a few. These wireless technologies may be integrated into the same or different chips or set of chips as other components within WD QQ110.

Antenna QQ111 may include one or more antennas or antenna arrays, configured to send and/or receive wireless signals, and is connected to interface QQ114. In certain alternative embodiments, antenna QQ111 may be separate from WD QQ110 and be connectable to WD QQ110 through an interface or port. Antenna QQ111, interface QQ114, and/or processing circuitry QQ120 may be configured to perform any receiving or transmitting operations described herein as being performed by a WD. Any information, data and/or signals may be received from a network node and/or another WD. In some embodiments, radio front end circuitry and/or antenna QQ111 may be considered an interface.

As illustrated, interface QQ114 comprises radio front end circuitry QQ112 and antenna QQ111. Radio front end circuitry QQ112 comprise one or more filters QQ118 and amplifiers QQ116. Radio front end circuitry QQ114 is connected to antenna QQ111 and processing circuitry QQ120, and is configured to condition signals communicated between antenna QQ111 and processing circuitry QQ120. Radio front end circuitry QQ112 may be coupled to or a part of antenna QQ111. In some embodiments, WD QQ110 may not include separate radio front end circuitry QQ112; rather, processing circuitry QQ120 may comprise radio front end circuitry and may be connected to antenna QQ111. Similarly, in some embodiments, some or all of RF transceiver circuitry QQ122 may be considered a part of interface QQ114. Radio front end circuitry QQ112 may receive digital data that is to be sent out to other network nodes or WDs via a wireless connection. Radio front end circuitry QQ112 may convert the digital data into a radio signal having the appropriate channel and bandwidth parameters using a combination of filters QQ118 and/or amplifiers QQ116. The radio signal may then be transmitted via antenna QQ111. Similarly, when receiving data, antenna QQ111 may collect radio signals which are then converted into digital data by radio front end circuitry QQ112. The digital data may be passed to processing circuitry QQ120. In other embodiments, the interface may comprise different components and/or different combinations of components.

Processing circuitry QQ120 may comprise a combination of one or more of a microprocessor, controller, microcontroller, central processing unit, digital signal processor, application-specific integrated circuit, field programmable gate array, or any other suitable computing device, resource, or combination of hardware, software, and/or encoded logic operable to provide, either alone or in conjunction with other WD QQ110 components, such as device readable medium QQ130, WD QQ110 functionality. Such functionality may include providing any of the various wireless features or benefits discussed herein. For example, processing circuitry QQ120 may execute instructions stored in device readable medium QQ130 or in memory within processing circuitry QQ120 to provide the functionality disclosed herein.

As illustrated, processing circuitry QQ120 includes one or more of RF transceiver circuitry QQ122, baseband processing circuitry QQ124, and application processing circuitry QQ126. In other embodiments, the processing circuitry may comprise different components and/or different combinations of components. In certain embodiments processing circuitry QQ120 of WD QQ110 may comprise a SOC. In some embodiments, RF transceiver circuitry QQ122, baseband processing circuitry QQ124, and application processing circuitry QQ126 may be on separate chips or sets of chips. In alternative embodiments, part or all of baseband processing circuitry QQ124 and application processing circuitry QQ126 may be combined into one chip or set of chips, and RF transceiver circuitry QQ122 may be on a separate chip or set of chips. In still alternative embodiments, part or all of RF transceiver circuitry QQ122 and baseband processing circuitry QQ124 may be on the same chip or set of chips, and application processing circuitry QQ126 may be on a separate chip or set of chips. In yet other alternative embodiments, part or all of RF transceiver circuitry QQ122, baseband processing circuitry QQ124, and application processing circuitry QQ126 may be combined in the same chip or set of chips. In some embodiments, RF transceiver circuitry QQ122 may be a part of interface QQ114. RF transceiver circuitry QQ122 may condition RF signals for processing circuitry QQ120.

In certain embodiments, some or all of the functionality described herein as being performed by a WD may be provided by processing circuitry QQ120 executing instructions stored on device readable medium QQ130, which in certain embodiments may be a computer-readable storage medium. In alternative embodiments, some or all of the functionality may be provided by processing circuitry QQ120 without executing instructions stored on a separate or discrete device readable storage medium, such as in a hard-wired manner. In any of those particular embodiments, whether executing instructions stored on a device readable storage medium or not, processing circuitry QQ120 can be configured to perform the described functionality. The benefits provided by such functionality are not limited to processing circuitry QQ120 alone or to other components of WD QQ110, but are enjoyed by WD QQ110 as a whole, and/or by end users and the wireless network generally.

Processing circuitry QQ120 may be configured to perform any determining, calculating, or similar operations (e.g., certain obtaining operations) described herein as being performed by a WD. These operations, as performed by processing circuitry QQ120, may include processing information obtained by processing circuitry QQ120 by, for example, converting the obtained information into other information, comparing the obtained information or converted information to information stored by WD QQ110, and/or performing one or more operations based on the obtained information or converted information, and as a result of said processing making a determination.

Device readable medium QQ130 may be operable to store a computer program, software, an application including one or more of logic, rules, code, tables, etc. and/or other instructions capable of being executed by processing circuitry QQ120. Device readable medium QQ130 may include computer memory (e.g., Random Access Memory (RAM) or Read Only Memory (ROM)), mass storage media (e.g., a hard disk), removable storage media (e.g., a Compact Disk (CD) or a Digital Video Disk (DVD)), and/or any other volatile or non-volatile, non-transitory device readable and/or computer executable memory devices that store information, data, and/or instructions that may be used by processing circuitry QQ120. In some embodiments, processing circuitry QQ120 and device readable medium QQ130 may be considered to be integrated.

User interface equipment QQ132 may provide components that allow for a human user to interact with WD QQ110. Such interaction may be of many forms, such as visual, audial, tactile, etc. User interface equipment QQ132 may be operable to produce output to the user and to allow the user to provide input to WD QQ110. The type of interaction may vary depending on the type of user interface equipment QQ132 installed in WD QQ110. For example, if WD QQ110 is a smart phone, the interaction may be via a touch screen; if WD QQ110 is a smart meter, the interaction may be through a screen that provides usage (e.g., the number of gallons used) or a speaker that provides an audible alert (e.g., if smoke is detected). User interface equipment QQ132 may include input interfaces, devices and circuits, and output interfaces, devices and circuits. User interface equipment QQ132 is configured to allow input of information into WD QQ110, and is connected to processing circuitry QQ120 to allow processing circuitry QQ120 to process the input information. User interface equipment QQ132 may include, for example, a microphone, a proximity or other sensor, keys/buttons, a touch display, one or more cameras, a USB port, or other input circuitry. User interface equipment QQ132 is also configured to allow output of information from WD QQ110, and to allow processing circuitry QQ120 to output information from WD QQ110. User interface equipment QQ132 may include, for example, a speaker, a display, vibrating circuitry, a USB port, a headphone interface, or other output circuitry. Using one or more input and output interfaces, devices, and circuits, of user interface equipment QQ132, WD QQ110 may communicate with end users and/or the wireless network, and allow them to benefit from the functionality described herein.

Auxiliary equipment QQ134 is operable to provide more specific functionality which may not be generally performed by WDs. This may comprise specialized sensors for doing measurements for various purposes, interfaces for additional types of communication such as wired communications etc. The inclusion and type of components of auxiliary equipment QQ134 may vary depending on the embodiment and/or scenario.

Power source QQ136 may, in some embodiments, be in the form of a battery or battery pack. Other types of power sources, such as an external power source (e.g., an electricity outlet), photovoltaic devices or power cells, may also be used. WD QQ110 may further comprise power circuitry QQ137 for delivering power from power source QQ136 to the various parts of WD QQ110 which need power from power source QQ136 to carry out any functionality described or indicated herein. Power circuitry QQ137 may in certain embodiments comprise power management circuitry. Power circuitry QQ137 may additionally or alternatively be operable to receive power from an external power source; in which case WD QQ110 may be connectable to the external power source (such as an electricity outlet) via input circuitry or an interface such as an electrical power cable. Power circuitry QQ137 may also in certain embodiments be operable to deliver power from an external power source to power source QQ136. This may be, for example, for the charging of power source QQ136. Power circuitry QQ137 may perform any formatting, converting, or other modification to the power from power source QQ136 to make the power suitable for the respective components of WD QQ110 to which power is supplied.

Figure 7:
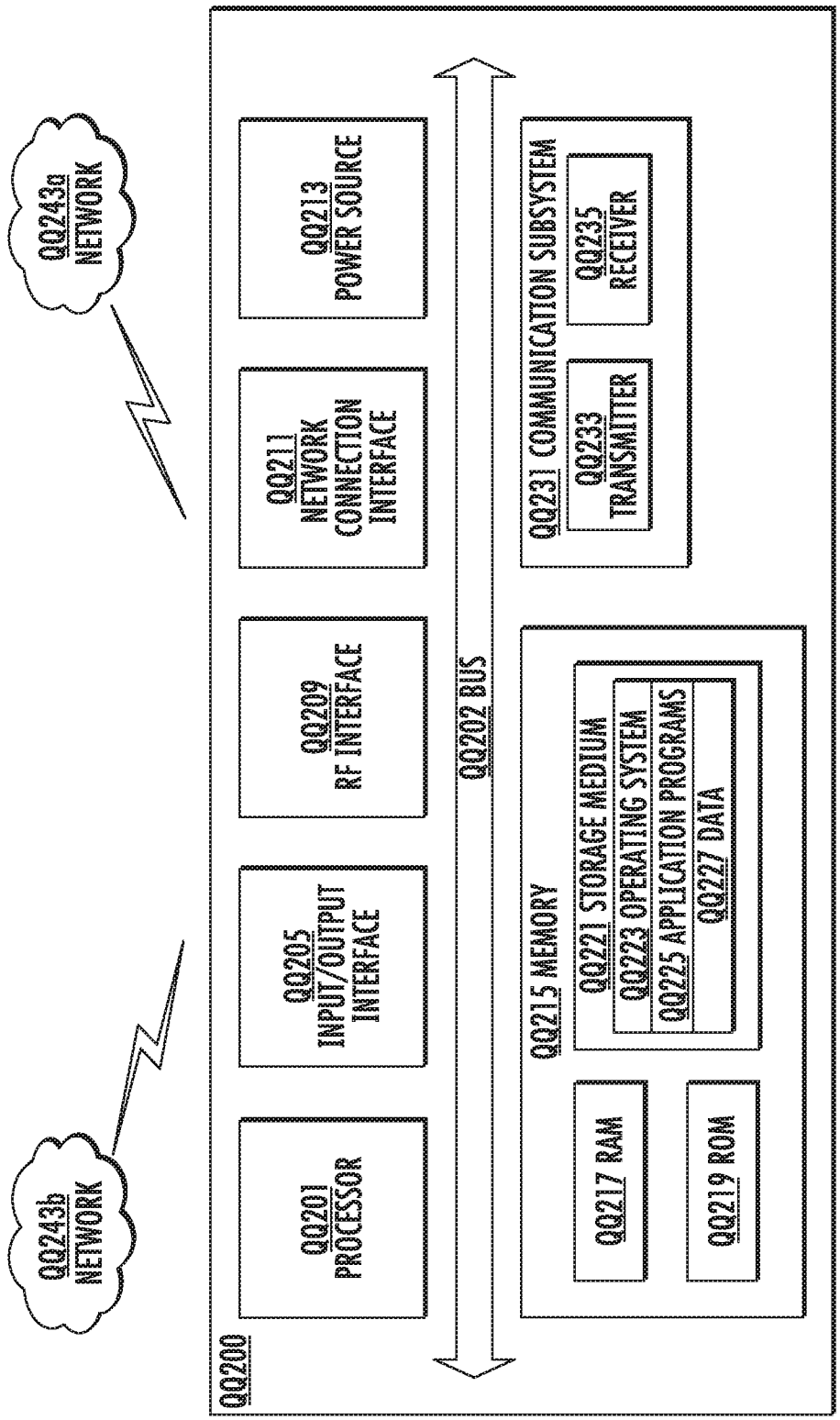
FIG. 7 is an example of a WD.

FIG. 7 illustrates one embodiment of a WD in accordance with various aspects described herein. As used herein, a user equipment or WD may not necessarily have a user in the sense of a human user who owns and/or operates the relevant device. Instead, a WD may represent a device that is intended for sale to, or operation by, a human user but which may not, or which may not initially, be associated with a specific human user (e.g., a smart sprinkler controller). Alternatively, a WD may represent a device that is not intended for sale to, or operation by, an end user but which may be associated with or operated for the benefit of a user (e.g., a smart power meter). WD QQ2200 may be any WD identified by the 3rd Generation Partnership Project (3GPP), including a NB-IoT WD, a machine type communication (MTC) WD, and/or an enhanced MTC (eMTC) WD. WD QQ200, as illustrated in FIG. 7, is one example of a WD configured for communication in accordance with one or more communication standards promulgated by the 3rd Generation Partnership Project (3GPP), such as 3GPP's GSM, UMTS, LTE, and/or 5G standards. As mentioned previously, the term WD and WD may be used interchangeable. Accordingly, although FIG. 7 is a WD, the components discussed herein are equally applicable to a WD, and vice-versa.

In FIG. 7, WD QQ200 includes processing circuitry QQ201 that is operatively coupled to input/output interface QQ205, radio frequency (RF) interface QQ209, network connection interface QQ211, memory QQ215 including random access memory (RAM) QQ217, read-only memory (ROM) QQ219, and storage medium QQ221 or the like, communication subsystem QQ231, power source QQ233, and/or any other component, or any combination thereof. Storage medium QQ221 includes operating system QQ223, application program QQ225, and data QQ227. In other embodiments, storage medium QQ221 may include other similar types of information. Certain WDs may utilize all of the components shown in FIG. 7, or only a subset of the components. The level of integration between the components may vary from one WD to another WD. Further, certain WDs may contain multiple instances of a component, such as multiple processors, memories, transceivers, transmitters, receivers, etc.

In FIG. 7, processing circuitry QQ201 may be configured to process computer instructions and data. Processing circuitry QQ201 may be configured to implement any sequential state machine operative to execute machine instructions stored as machine-readable computer programs in the memory, such as one or more hardware-implemented state machines (e.g., in discrete logic, FPGA, ASIC, etc.); programmable logic together with appropriate firmware; one or more stored program, general-purpose processors, such as a microprocessor or Digital Signal Processor (DSP), together with appropriate software; or any combination of the above. For example, the processing circuitry QQ201 may include two central processing units (CPUs). Data may be information in a form suitable for use by a computer.

In the depicted embodiment, input/output interface QQ205 may be configured to provide a communication interface to an input device, output device, or input and output device. WD QQ200 may be configured to use an output device via input/output interface QQ205. An output device may use the same type of interface port as an input device. For example, a USB port may be used to provide input to and output from WD QQ200. The output device may be a speaker, a sound card, a video card, a display, a monitor, a printer, an actuator, an emitter, a smartcard, another output device, or any combination thereof. WD QQ200 may be configured to use an input device via input/output interface QQ205 to allow a user to capture information into WD QQ200. The input device may include a touch-sensitive or presence-sensitive display, a camera (e.g., a digital camera, a digital video camera, a web camera, etc.), a microphone, a sensor, a mouse, a trackball, a directional pad, a trackpad, a scroll wheel, a smartcard, and the like. The presence-sensitive display may include a capacitive or resistive touch sensor to sense input from a user. A sensor may be, for instance, an accelerometer, a gyroscope, a tilt sensor, a force sensor, a magnetometer, an optical sensor, a proximity sensor, another like sensor, or any combination thereof. For example, the input device may be an accelerometer, a magnetometer, a digital camera, a microphone, and an optical sensor.

In FIG. 7, RF interface QQ209 may be configured to provide a communication interface to RF components such as a transmitter, a receiver, and an antenna. Network connection interface QQ211 may be configured to provide a communication interface to network QQ243a. Network QQ243a may encompass wired and/or wireless networks such as a local-area network (LAN), a wide-area network (WAN), a computer network, a wireless network, a telecommunications network, another like network or any combination thereof. For example, network QQ243a may comprise a Wi-Fi network. Network connection interface QQ211 may be configured to include a receiver and a transmitter interface used to communicate with one or more other devices over a communication network according to one or more communication protocols, such as Ethernet, TCP/IP, SONET, ATM, or the like. Network connection interface QQ211 may implement receiver and transmitter functionality appropriate to the communication network links (e.g., optical, electrical, and the like). The transmitter and receiver functions may share circuit components, software or firmware, or alternatively may be implemented separately.

RAM QQ217 may be configured to interface via bus QQ202 to processing circuitry QQ201 to provide storage or caching of data or computer instructions during the execution of software programs such as the operating system, application programs, and device drivers. ROM QQ219 may be configured to provide computer instructions or data to processing circuitry QQ201. For example, ROM QQ219 may be configured to store invariant low-level system code or data for basic system functions such as basic input and output (I/O), startup, or reception of keystrokes from a keyboard that are stored in a non-volatile memory. Storage medium QQ221 may be configured to include memory such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, or flash drives. In one example, storage medium QQ221 may be configured to include operating system QQ223, application program QQ225 such as a web browser application, a widget or gadget engine or another application, and data file QQ227. Storage medium QQ221 may store, for use by WD QQ200, any of a variety of various operating systems or combinations of operating systems.

Storage medium QQ221 may be configured to include a number of physical drive units, such as redundant array of independent disks (RAID), floppy disk drive, flash memory, USB flash drive, external hard disk drive, thumb drive, pen drive, key drive, high-density digital versatile disc (HD-DVD) optical disc drive, internal hard disk drive, Blu-Ray optical disc drive, holographic digital data storage (HDDS) optical disc drive, external mini-dual in-line memory module (DIMM), synchronous dynamic random access memory (SDRAM), external micro-DIMM SDRAM, smartcard memory such as a subscriber identity module or a removable user identity (SIM/RUIM) module, other memory, or any combination thereof. Storage medium QQ221 may allow WD QQ200 to access computer-executable instructions, application programs or the like, stored on transitory or non-transitory memory media, to off-load data, or to upload data. An article of manufacture, such as one utilizing a communication system may be tangibly embodied in storage medium QQ221, which may comprise a device readable medium.

In FIG. 7, processing circuitry QQ201 may be configured to communicate with network QQ243b using communication subsystem QQ231. Network QQ243a and network QQ243b may be the same network or networks or different network or networks. Communication subsystem QQ231 may be configured to include one or more transceivers used to communicate with network QQ243b. For example, communication subsystem QQ231 may be configured to include one or more transceivers used to communicate with one or more remote transceivers of another device capable of wireless communication such as another WD, WD, or base station of a radio access network (RAN) according to one or more communication protocols, such as IEEE 802.11, CDMA, WCDMA, GSM, LTE, UTRAN, WiMax, or the like. Each transceiver may include transmitter QQ233 and/or receiver QQ235 to implement transmitter or receiver functionality, respectively, appropriate to the RAN links (e.g., frequency allocations and the like). Further, transmitter QQ233 and receiver QQ235 of each transceiver may share circuit components, software or firmware, or alternatively may be implemented separately.

In the illustrated embodiment, the communication functions of communication subsystem QQ231 may include data communication, voice communication, multimedia communication, short-range communications such as Bluetooth, near-field communication, location-based communication such as the use of the global positioning system (GPS) to determine a location, another like communication function, or any combination thereof. For example, communication subsystem QQ231 may include cellular communication, Wi-Fi communication, Bluetooth communication, and GPS communication. Network QQ243b may encompass wired and/or wireless networks such as a local-area network (LAN), a wide-area network (WAN), a computer network, a wireless network, a telecommunications network, another like network or any combination thereof. For example, network QQ243b may be a cellular network, a Wi-Fi network, and/or a near-field network. Power source QQ213 may be configured to provide alternating current (AC) or direct current (DC) power to components of WD QQ200.

Figure 8:
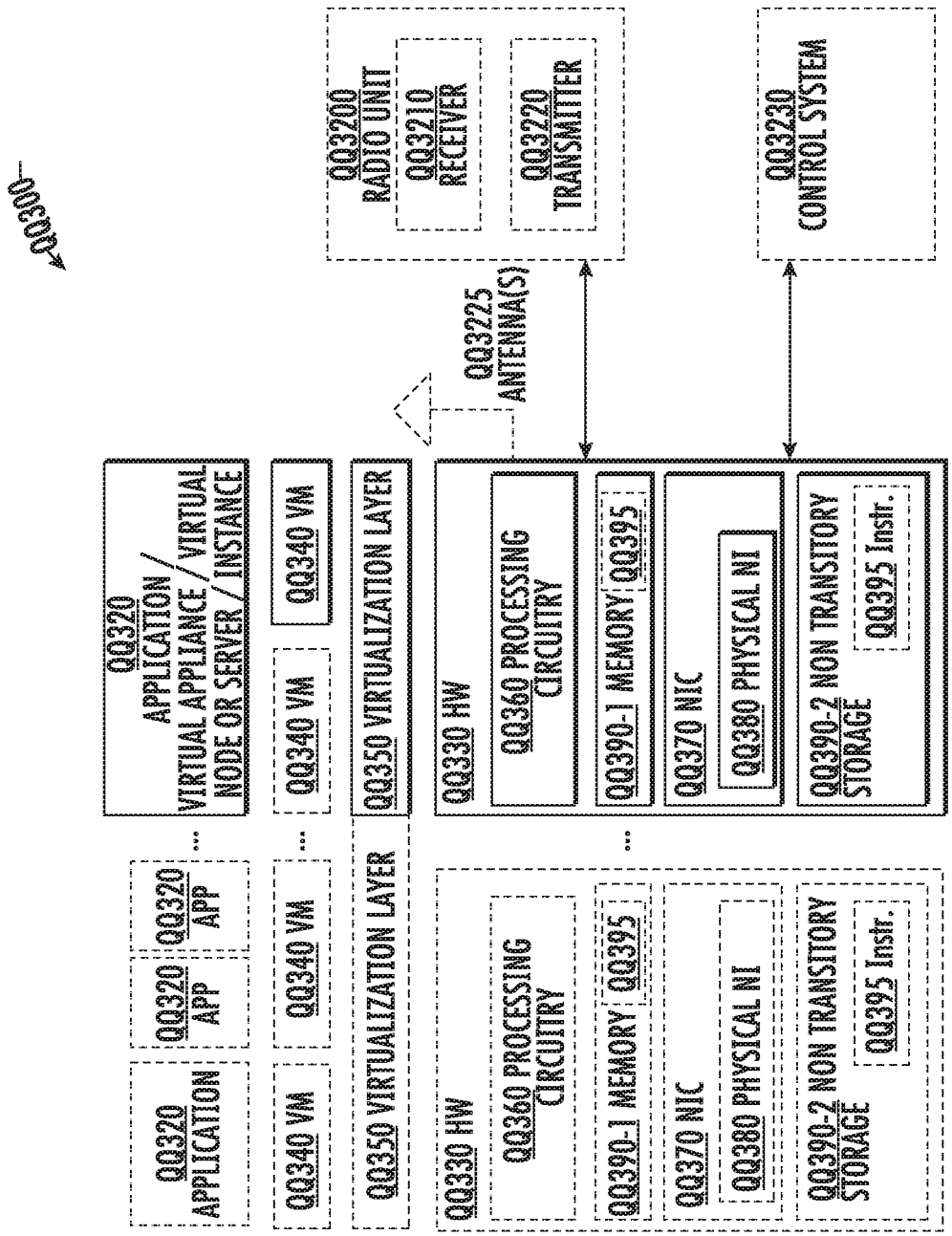
FIG. 8 is a block diagram of an example virtualization environment.

The features, benefits and/or functions described herein may be implemented in one of the components of WD QQ200 or partitioned across multiple components of WD QQ200. Further, the features, benefits, and/or functions described herein may be implemented in any combination of hardware, software or firmware. In one example, communication subsystem QQ231 may be configured to include any of the components described herein. Further, processing circuitry QQ201 may be configured to communicate with any of such components over bus QQ202. In another example, any of such components may be represented by program instructions stored in memory that when executed by processing circuitry QQ201 perform the corresponding functions described herein. In another example, the functionality of any of such components may be partitioned between processing circuitry QQ201 and communication subsystem QQ231. In another example, the non-computationally intensive functions of any of such components may be implemented in software or firmware and the computationally intensive functions may be implemented in hardware FIG. 8 is a schematic block diagram illustrating a virtualization environment QQ300 in which functions implemented by some embodiments may be virtualized. In the present context, virtualizing means creating virtual versions of apparatuses or devices which may include virtualizing hardware platforms, storage devices and networking resources. As used herein, virtualization can be applied to a node (e.g., a virtualized base station or a virtualized radio access node) or to a device (e.g., a WD, a wireless device or any other type of communication device) or components thereof and relates to an implementation in which at least a portion of the functionality is implemented as one or more virtual components (e.g., via one or more applications, components, functions, virtual machines or containers executing on one or more physical processing nodes in one or more networks).

In some embodiments, some or all of the functions described herein may be implemented as virtual components executed by one or more virtual machines implemented in one or more virtual environments QQ300 hosted by one or more of hardware nodes QQ330. Further, in embodiments in which the virtual node is not a radio access node or does not require radio connectivity (e.g., a core network node), then the network node may be entirely virtualized.

The functions may be implemented by one or more applications QQ320 (which may alternatively be called software instances, virtual appliances, network functions, virtual nodes, virtual network functions, etc.) operative to implement some of the features, functions, and/or benefits of some of the embodiments disclosed herein. Applications QQ320 are run in virtualization environment QQ300 which provides hardware QQ330 comprising processing circuitry QQ360 and memory QQ390. Memory QQ390 contains instructions QQ395 executable by processing circuitry QQ360 whereby application QQ320 is operative to provide one or more of the features, benefits, and/or functions disclosed herein.

Virtualization environment QQ300, comprises general-purpose or special-purpose network hardware devices QQ330 comprising a set of one or more processors or processing circuitry QQ360, which may be commercial off-the-shelf (COTS) processors, dedicated Application Specific Integrated Circuits (ASICs), or any other type of processing circuitry including digital or analog hardware components or special purpose processors. Each hardware device may comprise memory QQ390-1 which may be non-persistent memory for temporarily storing instructions QQ395 or software executed by processing circuitry QQ360. Each hardware device may comprise one or more network interface controllers (NICs) QQ370, also known as network interface cards, which include physical network interface QQ380. Each hardware device may also include non-transitory, persistent, machine-readable storage media QQ390-2 having stored therein software QQ395 and/or instructions executable by processing circuitry QQ360. Software QQ395 may include any type of software including software for instantiating one or more virtualization layers QQ350 (also referred to as hypervisors), software to execute virtual machines QQ340 as well as software allowing it to execute functions, features and/or benefits described in relation with some embodiments described herein.

Virtual machines QQ340, comprise virtual processing, virtual memory, virtual networking or interface and virtual storage, and may be run by a corresponding virtualization layer QQ350 or hypervisor. Different embodiments of the instance of virtual appliance QQ320 may be implemented on one or more of virtual machines QQ340, and the implementations may be made in different ways.

During operation, processing circuitry QQ360 executes software QQ395 to instantiate the hypervisor or virtualization layer QQ350, which may sometimes be referred to as a virtual machine monitor (VMM). Virtualization layer QQ350 may present a virtual operating platform that appears like networking hardware to virtual machine QQ340.

As shown in FIG. 8, hardware QQ330 may be a stand-alone network node with generic or specific components. Hardware QQ330 may comprise antenna QQ3225 and may implement some functions via virtualization. Alternatively, hardware QQ330 may be part of a larger cluster of hardware (e.g. such as in a data center or customer premise equipment (CPE)) where many hardware nodes work together and are managed via management and orchestration (MANO) QQ3100, which, among others, oversees lifecycle management of applications QQ320.

Virtualization of the hardware is in some contexts referred to as network function virtualization (NFV). NFV may be used to consolidate many network equipment types onto industry standard high volume server hardware, physical switches, and physical storage, which can be located in data centers, and customer premise equipment.

In the context of NFV, virtual machine QQ340 may be a software implementation of a physical machine that runs programs as if they were executing on a physical, non-virtualized machine. Each of virtual machines QQ340, and that part of hardware QQ330 that executes that virtual machine, be it hardware dedicated to that virtual machine and/or hardware shared by that virtual machine with others of the virtual machines QQ340, forms a separate virtual network elements (VNE).

Still in the context of NFV, Virtual Network Function (VNF) is responsible for handling specific network functions that run in one or more virtual machines QQ340 on top of hardware networking infrastructure QQ330 and corresponds to application QQ320 in FIG. 8.

In some embodiments, one or more radio units QQ3200 that each include one or more transmitters QQ3220 and one or more receivers QQ3210 may be coupled to one or more antennas QQ3225. Radio units QQ3200 may communicate directly with hardware nodes QQ330 via one or more appropriate network interfaces and may be used in combination with the virtual components to provide a virtual node with radio capabilities, such as a radio access node or a base station.

In some embodiments, some signaling can be effected with the use of control system QQ3230 which may alternatively be used for communication between the hardware nodes QQ330 and radio units QQ3200.

With reference to FIGURE QQ4, in accordance with an embodiment, a communication system includes telecommunication network QQ410, such as a 3GPP-type cellular network, which comprises access network QQ411, such as a radio access network, and core network QQ414. Access network QQ411 comprises a plurality of base stations QQ412a, QQ412b, QQ412c, such as NBs, eNBs, gNBs or other types of wireless access points, each defining a corresponding coverage area QQ413a, QQ413b, QQ413c. Each base station QQ412a, QQ412b, QQ412c is connectable to core network QQ414 over a wired or wireless connection QQ415. A first WD QQ491 located in coverage area QQ413c is configured to wirelessly connect to, or be paged by, the corresponding base station QQ412c. A second WD QQ492 in coverage area QQ413a is wirelessly connectable to the corresponding base station QQ412a. While a plurality of WDs QQ491, QQ492 are illustrated in this example, the disclosed embodiments are equally applicable to a situation where a sole WD is in the coverage area or where a sole WD is connecting to the corresponding base station QQ412.

Telecommunication network QQ410 is itself connected to host computer QQ430, which may be embodied in the hardware and/or software of a standalone server, a cloud-implemented server, a distributed server or as processing resources in a server farm. Host computer QQ430 may be under the ownership or control of a service provider, or may be operated by the service provider or on behalf of the service provider. Connections QQ421 and QQ422 between telecommunication network QQ410 and host computer QQ430 may extend directly from core network QQ414 to host computer QQ430 or may go via an optional intermediate network QQ420. Intermediate network QQ420 may be one of, or a combination of more than one of, a public, private or hosted network; intermediate network QQ420, if any, may be a backbone network or the Internet; in particular, intermediate network QQ420 may comprise two or more sub-networks (not shown).

Figure 9:
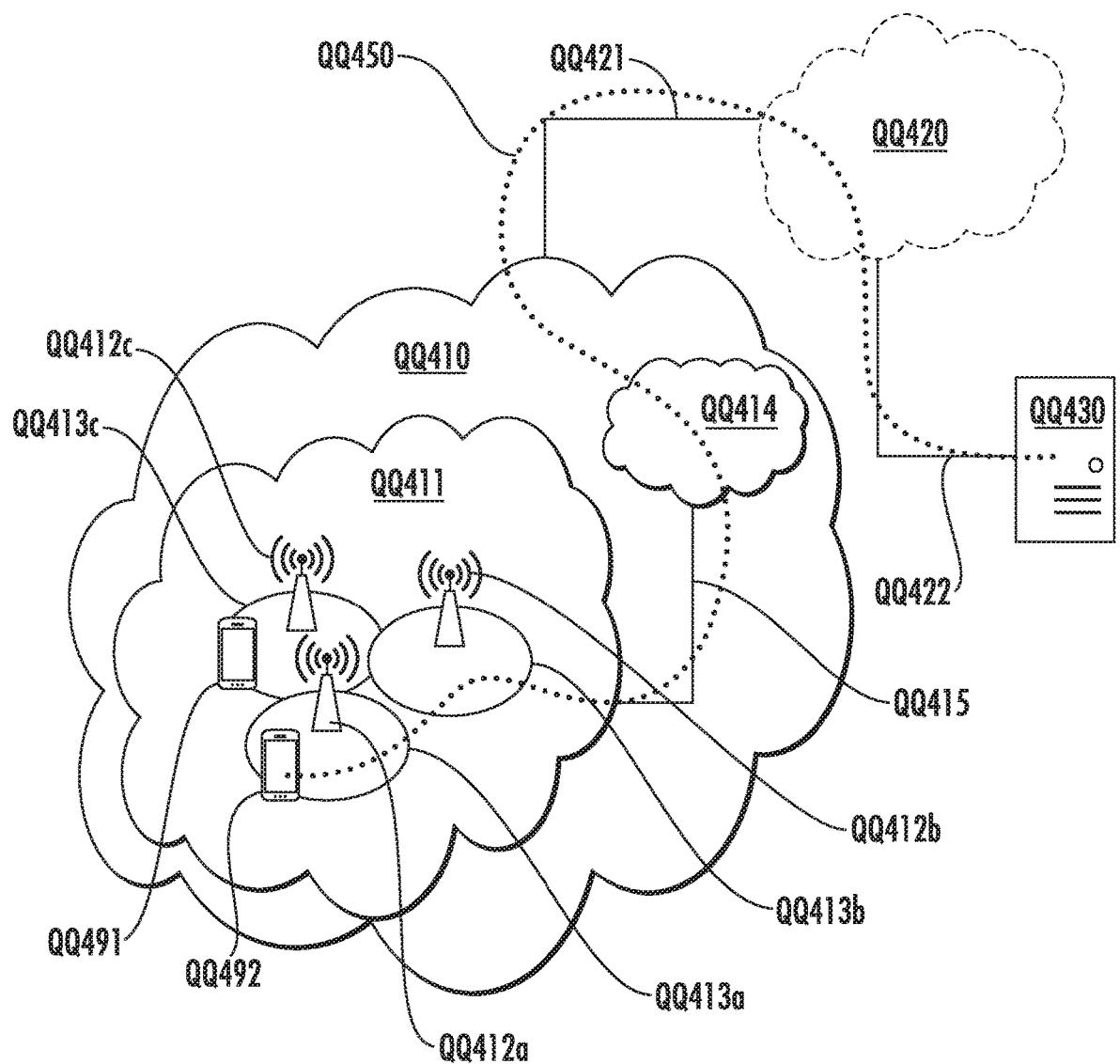
FIG. 9 is an illustration of a communication system.

The communication system of FIG. 9 as a whole enables connectivity between the connected WDs QQ491, QQ492 and host computer QQ430. The connectivity may be described as an over-the-top (OTT) connection QQ450. Host computer QQ430 and the connected WDs QQ491, QQ492 are configured to communicate data and/or signaling via OTT connection QQ450, using access network QQ411, core network QQ414, any intermediate network QQ420 and possible further infrastructure (not shown) as intermediaries. OTT connection QQ450 may be transparent in the sense that the participating communication devices through which OTT connection QQ450 passes are unaware of routing of uplink and downlink communications. For example, base station QQ412 may not or need not be informed about the past routing of an incoming downlink communication with data originating from host computer QQ430 to be forwarded (e.g., handed over) to a connected WD QQ491. Similarly, base station QQ412 need not be aware of the future routing of an outgoing uplink communication originating from the WD QQ491 towards the host computer QQ430.

Example implementations, in accordance with an embodiment, of the WD, base station and host computer discussed in the preceding paragraphs will now be described with reference to FIG. 10. In communication system QQ500, host computer QQ510 comprises hardware QQ515 including communication interface QQ516 configured to set up and maintain a wired or wireless connection with an interface of a different communication device of communication system QQ500. Host computer QQ510 further comprises processing circuitry QQ518, which may have storage and/or processing capabilities. In particular, processing circuitry QQ518 may comprise one or more programmable processors, application-specific integrated circuits, field programmable gate arrays or combinations of these (not shown) adapted to execute instructions. Host computer QQ510 further comprises software QQ511, which is stored in or accessible by host computer QQ510 and executable by processing circuitry QQ518. Software QQ511 includes host application QQ512. Host application QQ512 may be operable to provide a service to a remote user, such as WD QQ530 connecting via OTT connection QQ550 terminating at WD QQ530 and host computer QQ510. In providing the service to the remote user, host application QQ512 may provide user data which is transmitted using OTT connection QQ550.

Communication system QQ500 further includes base station QQ520 provided in a telecommunication system and comprising hardware QQ525 enabling it to communicate with host computer QQ510 and with WD QQ530. Hardware QQ525 may include communication interface QQ526 for setting up and maintaining a wired or wireless connection with an interface of a different communication device of communication system QQ500, as well as radio interface QQ527 for setting up and maintaining at least wireless connection QQ570 with WD QQ530 located in a coverage area (not shown in FIG. 10) served by base station QQ520. Communication interface QQ526 may be configured to facilitate connection QQ560 to host computer QQ510. Connection QQ560 may be direct or it may pass through a core network (not shown in FIG. 10) of the telecommunication system and/or through one or more intermediate networks outside the telecommunication system. In the embodiment shown, hardware QQ525 of base station QQ520 further includes processing circuitry QQ528, which may comprise one or more programmable processors, application-specific integrated circuits, field programmable gate arrays or combinations of these (not shown) adapted to execute instructions. Base station QQ520 further has software QQ521 stored internally or accessible via an external connection.

Communication system QQ500 further includes WD QQ530 already referred to. Its hardware QQ535 may include radio interface QQ537 configured to set up and maintain wireless connection QQ570 with a base station serving a coverage area in which WD QQ530 is currently located. Hardware QQ535 of WD QQ530 further includes processing circuitry QQ538, which may comprise one or more programmable processors, application-specific integrated circuits, field programmable gate arrays or combinations of these (not shown) adapted to execute instructions. WD QQ530 further comprises software QQ531, which is stored in or accessible by WD QQ530 and executable by processing circuitry QQ538. Software QQ531 includes client application QQ532. Client application QQ532 may be operable to provide a service to a human or non-human user via WD QQ530, with the support of host computer QQ510. In host computer QQ510, an executing host application QQ512 may communicate with the executing client application QQ532 via OTT connection QQ550 terminating at WD QQ530 and host computer QQ510. In providing the service to the user, client application QQ532 may receive request data from host application QQ512 and provide user data in response to the request data. OTT connection QQ550 may transfer both the request data and the user data. Client application QQ532 may interact with the user to generate the user data that it provides.

Figure 10:
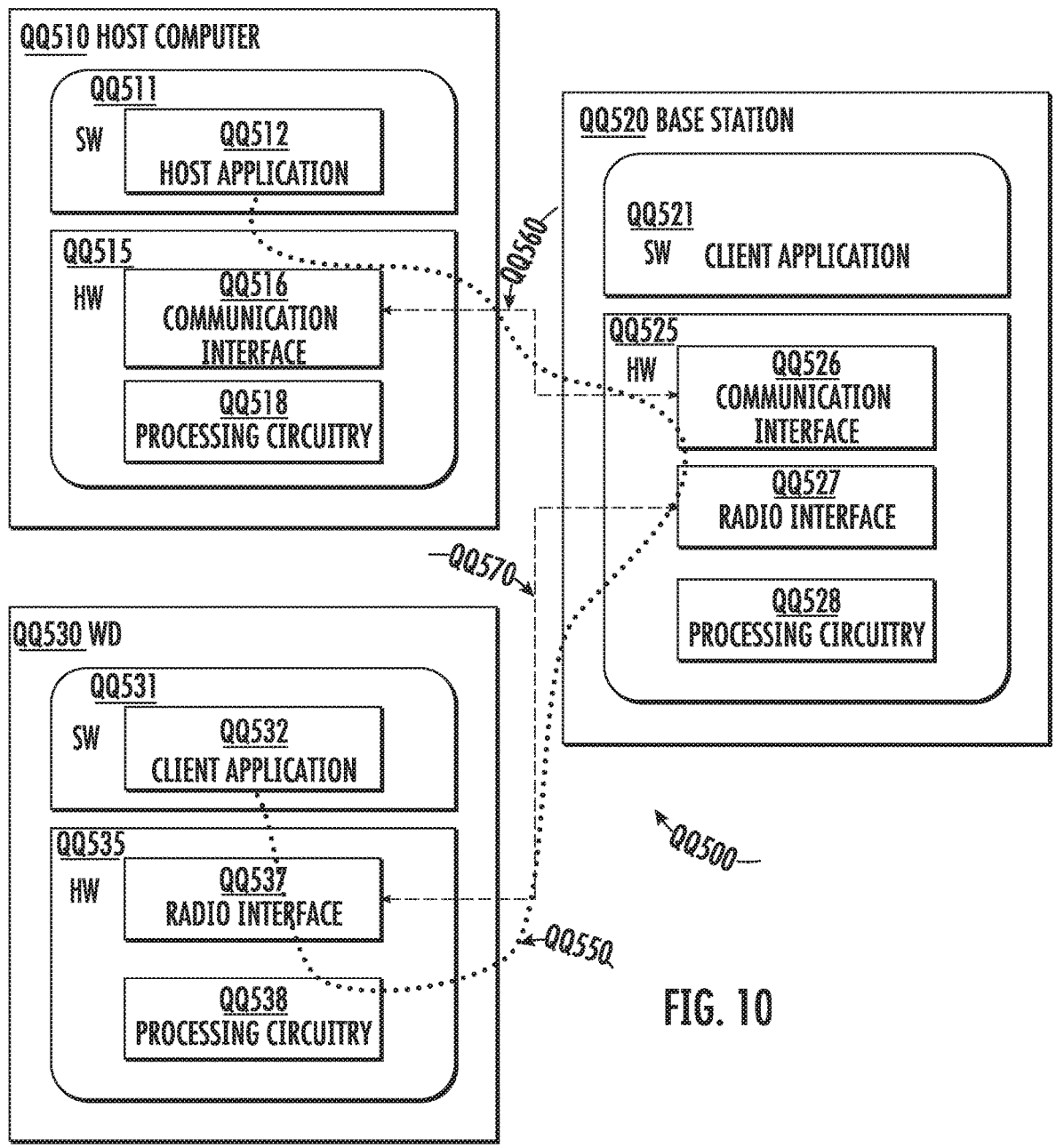
FIG. 10 illustrates a host computer, base station and WD.

It is noted that host computer QQ510, base station QQ520 and WD QQ530 illustrated in FIG. 10 may be similar or identical to host computer QQ430, one of base stations QQ412a, QQ412b, QQ412c and one of WDs QQ491, QQ492 of FIG. 9, respectively. This is to say, the inner workings of these entities may be as shown in FIG. 10 and independently, the surrounding network topology may be that of FIG. 9.

In FIG. 10, OTT connection QQ550 has been drawn abstractly to illustrate the communication between host computer QQ510 and WD QQ530 via base station QQ520, without explicit reference to any intermediary devices and the precise routing of messages via these devices. Network infrastructure may determine the routing, which it may be configured to hide from WD QQ530 or from the service provider operating host computer QQ510, or both. While OTT connection QQ550 is active, the network infrastructure may further take decisions by which it dynamically changes the routing (e.g., on the basis of load balancing consideration or reconfiguration of the network).

Wireless connection QQ570 between WD QQ530 and base station QQ520 is in accordance with the teachings of the embodiments described throughout this disclosure. One or more of the various embodiments improve the performance of OTT services provided to WD QQ530 using OTT connection QQ550, in which wireless connection QQ570 forms the last segment. More precisely, the teachings of these embodiments may improve the connection of a coaxial structure to a PCB and thereby provide benefits such as easy implementation, low insertion loss and has very low PIM, as well can be used in 4G and 5G radio systems to connect RF modules together.

A measurement procedure may be provided for the purpose of monitoring data rate, latency and other factors on which the one or more embodiments improve. There may further be an optional network functionality for reconfiguring OTT connection QQ550 between host computer QQ510 and WD QQ530, in response to variations in the measurement results. The measurement procedure and/or the network functionality for reconfiguring OTT connection QQ550 may be implemented in software QQ511 and hardware QQ515 of host computer QQ510 or in software QQ531 and hardware QQ535 of WD QQ530, or both. In embodiments, sensors (not shown) may be deployed in or in association with communication devices through which OTT connection QQ550 passes; the sensors may participate in the measurement procedure by supplying values of the monitored quantities exemplified above, or supplying values of other physical quantities from which software QQ511, QQ531 may compute or estimate the monitored quantities. The reconfiguring of OTT connection QQ550 may include message format, retransmission settings, preferred routing etc.; the reconfiguring need not affect base station QQ520, and it may be unknown or imperceptible to base station QQ520. Such procedures and functionalities may be known and practiced in the art. In certain embodiments, measurements may involve proprietary WD signaling facilitating host computer QQ510's measurements of throughput, propagation times, latency and the like. The measurements may be implemented in that software QQ511 and QQ531 causes messages to be transmitted, in particular empty or 'dummy' messages, using OTT connection QQ550 while it monitors propagation times, errors etc.

Figure 11:
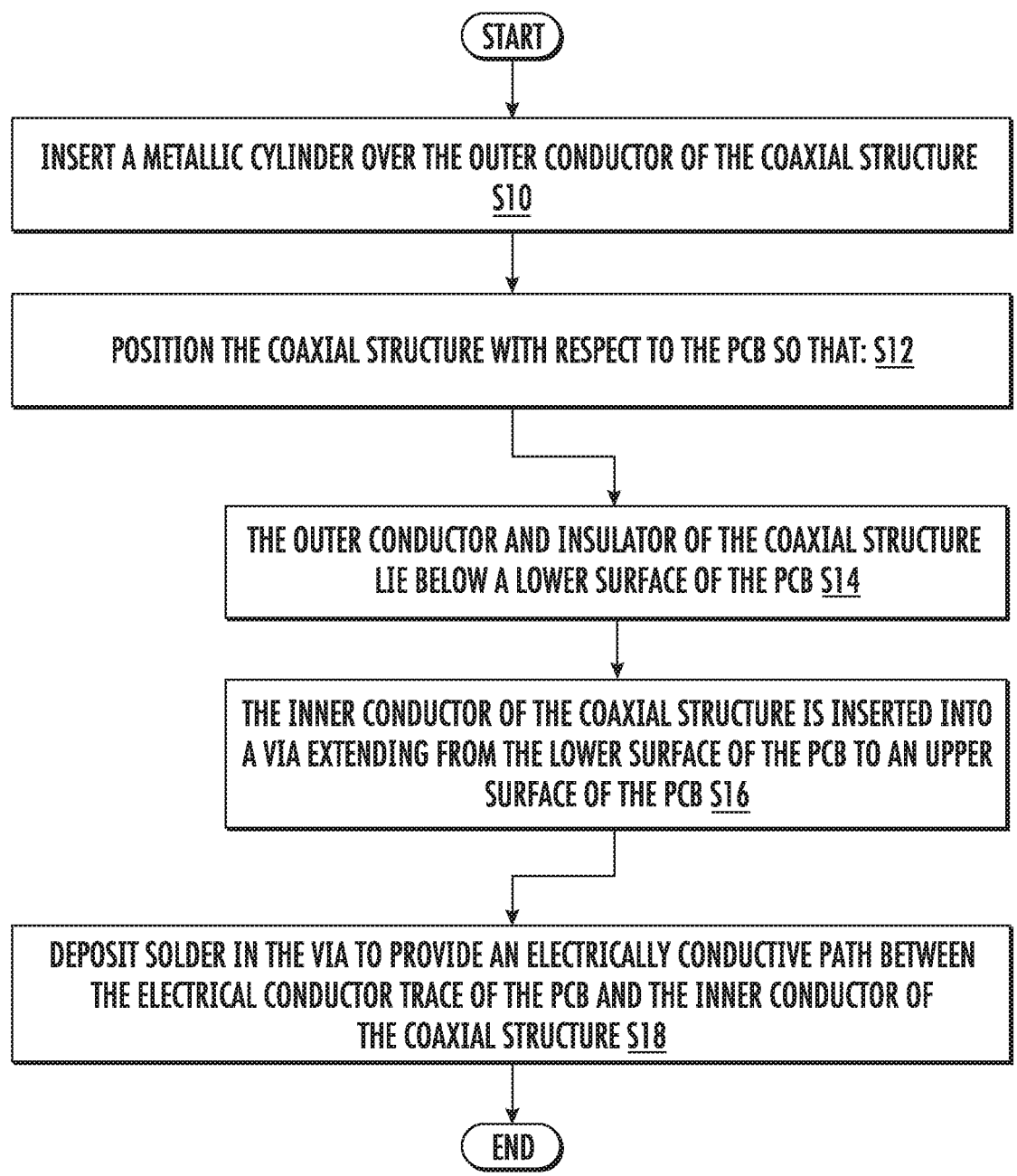
FIG. 11 is a flowchart of an example process of constructing a coaxial-to-PCB interface according to principles set forth herein.

FIG. 11 is a flowchart of an example process for constructing a coaxial-to-PCB interface 10. This process can be performed by humans and/or machines. The process includes inserting a metallic cylinder 18 over the outer conductor 20 of the coaxial structure (Block S10). The process also includes positioning the coaxial structure with respect to the PCB 16 so that (Block S12): the outer conductor 20 and insulator 32 of the coaxial structure lie below a lower surface of the PCB 16 (Block S14; and the inner conductor 12 of the coaxial structure is inserted into a via 40 extending from the lower surface of the PCB 16 to an upper surface of the PCB 16 (Block S16). The process further includes depositing solder in the via 40 to provide an electrically conductive path between the PCB electrical conductor trace 14 of the PCB 16 and the inner conductor 12 of the coaxial structure (Block S18).

According to one aspect, a coaxial-to-printed circuit board, PCB, interface 10 is provided. The interface 10 includes: a PCB 16 having a first dielectric constant. The PCB 16 has: a PCB lower ground plane 22 on a lower surface of the PCB 16; a PCB upper ground plane 24 on an upper surface of the PCB 16 opposite the PCB lower surface; a PCB electrical conductor trace 14 above the PCB lower ground plane 22 and below the PCB upper ground plane 24; and a via 40 extending from a lower surface of the PCB 16 to an upper surface of the PCB 16. The interface 10 also includes a coaxial structure having an outer conductor 20 and an inner conductor 12, the coaxial structure terminating at an end, the inner conductor 12 extending beyond an extent of the outer conductor 20 at the end of the coaxial structure, the inner conductor 12 being configured to be inserted into the via 40 and being further configured to be soldered to the PCB electrical conductor trace 14 by adding solder to the via 40, the PCB electrical conductor trace 14 being configured to make electrical contact with solder added to the via 40. The interface 10 further includes a metallic cylinder 18 having a thickness and an outer perimeter, and being configured to at least partially surround the outer conductor 20 and form a capacitive gap between the outer conductor 20 of the coaxial structure and PCB lower ground plane 22.

According to this aspect, in some embodiments, the interface 10 further includes a solder mask 38 on the lower surface of the PCB 16, wherein the metallic cylinder 18 is separated from the PCB lower ground plane 22 by the solder mask 38. In some embodiments, at least one of the thickness, a distance from the outer conductor 20 of the coaxial structure to the outer perimeter of the metallic cylinder 18 being selected to at least partially match a first impedance of the coaxial-to-PCB interface 10 to a second impedance of the coaxial structure. In some embodiments, the PCB electrical conductor has a transition trace along a length extending away from the inner conductor 12 of the coaxial structure. In some embodiments, the taper is selected to at least partially match the first impedance of the coaxial-to-PCB interface 10 to a third impedance of the PCB electrical conductor trace 14. In some embodiments, the PCB electrical conductor trace 14 has an end portion that at least partially surrounds the via 40. In some embodiments, the interface 10 further includes a snorkel, the snorkel being a cavity, the snorkel extending from the PCB lower surface to the PCB upper surface. In some embodiments, the inner conductor 12 of the coaxial structure extends to a location above the PCB upper surface. In some embodiments, the inner conductor 12 of the coaxial structure is tapered at an end of the inner conductor 12. In some embodiments, the metallic cylinder 18, the outer conductor 20 and the inner conductor 12 of the coaxial structure are coaxial with respect to one another.

According to another aspect, a coaxial-to-PCB, interface 10 includes a PCB 16 comprising: a lower surface partially covered by a lower ground plane 22; an upper surface partially covered by an upper ground plane 24 opposite the lower surface; a dielectric slab between the lower ground plane 22 and the upper ground plane 24; a via 40 extending through the dielectric slab from the lower surface to the upper surface; and an electrical conductor trace 14 between the lower surface of the PCB 16 and the upper surface of the PCB 16, the electrical conductor trace 14 of the PCB 16 being in electrical contact with solder deposited into the via 40. The interface 10 also includes a coaxial structure that includes an outer conductor 20 terminating below the lower ground plane 22 of the PCB 16; and an inner conductor 12 being inserted into the via 40 before deposition of the solder, the inner conductor 12 of the coaxial structure terminating above the lower ground plane 22 of the PCB 16. The interface also includes a metallic cylinder 18 below the lower ground plane 22 of the PCB 16, the metallic cylinder being concentric with and exterior to the outer conductor 20 of the coaxial structure when the inner conductor 12 of the coaxial structure is inserted into the via 40.

According to this aspect, in some embodiments, the metallic cylinder 18 has a circular cross section. In some embodiments, the interface 10 further includes a solder mask 38 on the lower surface of the PCB 16, wherein the metallic cylinder 18 forms a capacitive ring that capacitively couples the lower ground plane 22 of the PCB 16 to the coaxial structure through the solder mask 38. In some embodiments, the metallic cylinder has a height and makes electrical contact with a PCB solder mask 38 below the lower ground plane 22 of the PCB 16. In some embodiments, the inner conductor 12 of the coaxial structure passes through the via 40 and extends above the upper ground plane 24 of the PCB 16.

According to yet another aspect, a method is provided for constructing a coaxial-to-PCB interface 10 to couple signals between an electrical conductor trace 14 in a PCB 16 and an inner conductor 12 of a coaxial structure, the coaxial structure having an insulator surrounded by an outer conductor 20. The method includes: inserting a metallic cylinder 18 over the outer conductor 20 of the coaxial structure, and positioning the coaxial structure with respect to the PCB 16 so that: the outer conductor 20 and insulator of the coaxial structure lie below a lower surface of the PCB 16; and the inner conductor 12 of the coaxial structure is inserted into a via 40 extending from the lower surface of the PCB 16 to an upper surface of the PCB 16. The method also includes depositing solder in the via 40 to provide an electrically conductive path between the electrical conductor trace 14 of the PCB 16 and the inner conductor 12 of the coaxial structure.

According to this aspect, in some embodiments, the positioning further includes causing the metallic cylinder 18 to make contact with a solder mask 38 on the lower surface of the PCB 16. In some embodiments, positioning the coaxial structure so that the inner conductor 12 of the coaxial structure is inserted into the via 40 includes inserting the inner conductor 12 of the coaxial structure through an annular ring formed by the end portion of the electrical conductor trace 14. In some embodiments, the method further includes applying force to the PCB 16 to maintain contact between a solder mask 38 on an under side of the lower ground plane 22 of the PCB 16 and an upper end of the metallic cylinder 18. In some embodiments, the method further includes applying force to the PCB 16 to maintain contact between an upper edge of the metallic cylinder 18 and a solder mask 38 on a lower side of the lower ground plane 22 of the PCB 16.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein.

Some embodiments include the following:

A1. A coaxial connector to printed circuit board (PCB) interface comprising: a PCB having a via, a PCB trace and a PCB ground;
 a coax connector center output pin connected to the PCB trace, the center output pin being connected the coaxial ground;
 the center output pin being inserted and soldered into the via; and
 a capacitive ring coupling the coaxial ground to the PCB ground forming a gap between the PCB ground and the capacitive ring.

A2. The apparatus of any of the prior embodiments further comprising:
 a shielding wall located around the via to contain any energy leaking from the gap between the PCB ground and capacitive ring.

A3. The apparatus of any of embodiment wherein the shielding wall comprises: a plurality of vias located around the center output pin A4. The apparatus of any of the prior embodiments wherein the PCB is mounted on a metal chassis, the meal chassis forming a ground for the coaxial connector and a ground for the capacitive ring.

A5. The apparatus of any of the prior embodiments further comprising:
a via located at the end of the track with pads on all layers, the coax center connector is soldered to the pads.

A6. The apparatus of any of the prior embodiments further comprising:
an anti-pad being inserted on the PCB ground layers to form a clearance between the pads and the ground.

A7. The apparatus of any of the prior embodiments wherein the capacitive ring is further defined as being located near to the PCB ground.

A8. The apparatus of any of the prior embodiments further comprising:
a snorkel structure located proximate to the coax center output pin to prevent a vacuum forming below the PCB and causing soldering problems that could lead to PIM degradation.

At least some of the following abbreviations may be used in this disclosure. If there is an inconsistency between abbreviations, preference should be given to how it is used above. If listed multiple times below, the first listing should be preferred over any subsequent listing(s).

| Abbreviation | Explanation |
| --- | --- |
| FDD | Frequency Division Duplex |
| TDD | Time Domain Duplex |
| AAS | Advanced Antenna Systems |
| WCDMA | Wideband Code Division Multiple Access |
| PIM | Passive Intermodulation |
| 1x RTT | CDMA2000 1x Radio Transmission Technology |
| 3GPP | 3rd Generation Partnership Project |
| 5G | 5th Generation |
| ABS | Almost Blank Subframe |
| ARQ | Automatic Repeat Request |
| AWGN | Additive White Gaussian Noise |
| BCCH | Broadcast Control Channel |
| BCH | Broadcast Channel |
| CA | Carrier Aggregation |
| CC | Carrier Component |
| CCCH SDU | Common Control Channel SDU |
| CDMA | Code Division Multiplexing Access |
| CGI | Cell Global Identifier |
| CIR | Channel Impulse Response |
| CP | Cyclic Prefix |
| CPICH | Common Pilot Channel |
| CPICH Ec/No | CPICH Received energy per chip divided by the power density in the band |
| CNG | Channel Noise Generator |
| CQI | Channel Quality information |
| C-RNTI | Cell RNTI |
| CSI | Channel State Information |
| DCCH | Dedicated Control Channel |
| DL | Downlink |
| DM | Demodulation |
| DMRS | Demodulation Reference Signal |
| DRX | Discontinuous Reception |
| DTX | Discontinuous Transmission |
| DTCH | Dedicated Traffic Channel |
| DUT | Device Under Test |
| E-CID | Enhanced Cell-ID (positioning method) |
| E-SMLC | Evolved-Serving Mobile Location Centre |
| ECGI | Evolved CGI |
| eNB | E-UTRAN NodeB |
| ePDCCH | enhanced Physical Downlink Control Channel |
| E-SMLC | evolved Serving Mobile Location Center |
| E-UTRA | Evolved UTRA E-UTRAN Evolved UTRAN |
| FDD | Frequency Division Duplex |
| FFS | For Further Study |
| GERAN | GSM EDGE Radio Access Network |
| gNB | Base Station in NR |
| GNSS | Global Navigation Satellite System |
| GSM | Global System for Mobile communication |

-continued

| Abbreviation | Explanation |
| --- | --- |
| HARQ | Hybrid Automatic Repeat Request |
| HO | Handover |
| HSPA | High Speed Packet Access |
| HRPD | High Rate Packet Data |
| LOS | Line of Sight |
| LPP | LTE Positioning Protocol |
| LTE | Long-Term Evolution |
| MAC | Medium Access Control |
| MBMS | Multimedia Broadcast Multicast Services |
| MBSFN | Multimedia Broadcast multicast service Single Frequency Network |
| MBSFN ABS | MBSFN Almost Blank Subframe |
| MDT | Minimization of Drive Tests |
| MIB | Master Information Block |
| MME | Mobility Management Entity |
| MSC | Mobile Switching Center |
| NPDCCH | Narrowband Physical Downlink Control Channel |
| NR | New Radio |
| OFDM | Orthogonal Frequency Division Multiplexing |
| OFDMA | Orthogonal Frequency Division Multiple Access |
| OSS | Operations Support System |
| OTDOA | Observed Time Difference of Arrival |
| OAM | Operation and Maintenance |
| PBCH | Physical Broadcast Channel |
| P-CCPCH | Primary Common Control Physical Channel |
| PCell | Primary Cell |
| PCFICH | Physical Control Format Indicator Channel |
| PDCCH | Physical Downlink Control Channel |
| PDCP | Packet Data Convergence Protocol |
| PDP | Profile Delay Profile |
| PDSCH | Physical Downlink Shared Channel |
| PGW | Packet Gateway |
| PHICH | Physical Hybrid-ARQ Indicator Channel |
| PLMN | Public Land Mobile Network |
| PMI | Precoder Matrix Indicator |
| PRACH | Physical Random Access Channel |
| PRS | Positioning Reference Signal |
| PSS | Primary Synchronization Signal |
| PUCCH | Physical Uplink Control Channel |
| PUSCH | Physical Uplink Shared Channel |
| RACH | Random Access Channel |
| QAM | Quadrature Amplitude Modulation |
| RAN | Radio Access Network |
| RAT | Radio Access Technology |
| RLC | Radio Link Control |
| RLM | Radio Link Management |
| RNC | Radio Network Controller |
| RNTI | Radio Network Temporary Identifier |
| RRC | Radio Resource Control |
| RRM | Radio Resource Management |
| RS | Reference Signal |
| RSCP | Received Signal Code Power |
| RSRP | Reference Symbol Received Power or Reference Signal Received Power |
| RSRQ | Reference Signal Received Quality or Reference Symbol Received Quality |
| RSSI | Received Signal Strength Indicator |
| RSTD | Reference Signal Time Difference |
| SCH | Synchronization Channel |
| SCell | Secondary Cell |
| SDAP | Service Data Adaptation Protocol |
| SDU | Service Data Unit |
| SFN | System Frame Number |
| SGW | Serving Gateway |
| SI | System Information |
| SIB | System Information Block |
| SNR | Signal to Noise Ratio |
| SON | Self Optimized Network |
| SS | Synchronization Signal |
| SSS | Secondary Synchronization Signal |
| TDD | Time Division Duplex |
| TDOA | Time Difference of Arrival |
| TOA | Time of Arrival |
| TSS | Tertiary Synchronization Signal |
| TTI | Transmission Time Interval |
| UE | User Equipment |
| UL | Uplink |

| Abbreviation | Explanation |
| --- | --- |
| UMTS | Universal Mobile Telecommunication System |
| USIM | Universal Subscriber Identity Module |
| UTDOA | Uplink Time Difference of Arrival |
| UTRA | Universal Terrestrial Radio Access |
| UTRAN | Universal Terrestrial Radio Access Network |
| WCDMA | Wide CDMA |
| WLAN | Wide Local Area Network |

As will be appreciated by one of skill in the art, the concepts described herein may be embodied as a method, data processing system, and/or computer program product. Accordingly, the concepts described herein may take the form of an entirely hardware embodiment, an entirely software embodiment or an embodiment combining software and hardware aspects all generally referred to herein as a "circuit" or "module." Furthermore, the disclosure may take the form of a computer program product on a tangible computer usable storage medium having computer program code embodied in the medium that can be executed by a computer. Any suitable tangible computer readable medium may be utilized including hard disks, CD-ROMs, electronic storage devices, optical storage devices, or magnetic storage devices.

Some embodiments are described herein with reference to flowchart illustrations and/or block diagrams of methods, systems and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable memory or storage medium that can direct a computer or other programmable data processing apparatus to function in a particular manner, such that the instructions stored in the computer readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Computer program code for carrying out operations of the concepts described herein may be written in an object oriented programming language such as Java® or C++. However, the computer program code for carrying out operations of the disclosure may also be written in conventional procedural programming languages, such as the "C" programming language. The program code may execute entirely on the user's computer, partly on the user's computer, as a stand-alone software package, partly on the user's computer and partly on a remote computer or entirely on the remote computer. In the latter scenario, the remote computer may be connected to the user's computer through a local area network (LAN) or a wide area network (WAN), or the connection may be made to an external computer (for example, through the Internet using an Internet Service Provider).

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the embodiments described herein are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A coaxial-to-printed circuit board (PCB) interface, comprising:
    a PCB having a first dielectric constant and comprising:
        a PCB lower ground plane on a lower surface of the PCB;
        a PCB upper ground plane on an upper surface of the PCB opposite the lower surface of the PCB;
        a PCB electrical conductor trace above the PCB lower ground plane and below the PCB upper ground plane; and
        a via extending from the lower surface of the PCB to the upper surface of the PCB;
    a coaxial structure having an outer conductor and an inner conductor, the outer conductor of the coaxial structure terminating at a first end, the inner conductor extending beyond the first end, the inner conductor being configured to be inserted into the via and being further configured to be soldered to the PCB electrical conductor trace by adding solder to the via, the PCB electrical conductor trace being configured to make electrical contact with solder added to the via; and
    a metallic cylinder having a thickness and an outer perimeter, and being configured to at least partially surround the outer conductor and form a capacitive gap between the outer conductor of the coaxial structure and the PCB lower ground plane, the metallic cylinder terminating at a second end flush with the first end of the outer conductor.

2. The coaxial-to-PCB interface of claim 1, further including a solder mask on the lower surface of the PCB, wherein the metallic cylinder is separated from the PCB lower ground plane by the solder mask.

3. The coaxial-to-PCB interface of claim 1, wherein at least one of the thickness, a distance from the outer conductor of the coaxial structure to the outer perimeter of the metallic cylinder, and a second dielectric constant of the metallic cylinder is selected to at least partially match a first impedance of the coaxial-to-PCB interface to a second impedance of the coaxial structure.

4. The coaxial-to-PCB interface of claim 3, wherein the PCB electrical conductor trace has a transition trace along a length extending away from the inner conductor of the coaxial structure.

5. The coaxial-to-PCB interface of claim 4, wherein a taper of the transition trace is selected to at least partially match the first impedance of the coaxial-to-PCB interface to a third impedance of the PCB electrical conductor trace.

6. The coaxial-to-PCB interface of claim 1, wherein the PCB electrical conductor trace has an end portion that at least partially surrounds the via.

7. The coaxial-to-PCB interface of claim 1, further comprising a snorkel, the snorkel being a cavity, the snorkel extending from the lower surface of the PCB to the upper surface of the PCB.

8. The coaxial-to-PCB interface of claim 1, wherein the inner conductor of the coaxial structure extends to a location above the upper surface of the PCB.

9. The coaxial-to-PCB interface of claim 1, wherein the inner conductor of the coaxial structure is tapered at an end of the inner conductor.

10. The coaxial-to-PCB interface of claim 1, wherein the metallic cylinder, the outer conductor and the inner conductor of the coaxial structure are coaxial with respect to one another.

11. A coaxial-to-printed circuit board (PCB) interface, comprising:
a PCB comprising:
a lower surface partially covered by a PCB lower ground plane;
an upper surface partially covered by a PCB upper ground plane opposite the lower surface;
a dielectric slab between the PCB lower ground plane and the PCB upper ground plane;
a via extending through the dielectric slab from the lower surface to the upper surface; and
an electrical conductor trace between the lower surface of the PCB and the upper surface of the PCB, the electrical conductor trace of the PCB being in electrical contact with solder deposited into the via; and
a coaxial structure comprising:
an outer conductor terminating at a first end; and
an inner conductor being inserted into the via before deposition of the solder, the inner conductor of the coaxial structure extending beyond the first end, and terminating above the PCB lower ground plane; and
a metallic cylinder below the PCB lower ground plane, the metallic cylinder being concentric with and exterior to the outer conductor of the coaxial structure when the inner conductor of the coaxial structure is inserted into the via, the metallic cylinder terminating at a second end flush with the first end of the outer conductor.

12. The coaxial-to-PCB interface of claim 11, wherein the metallic cylinder has a circular cross section.

13. The coaxial-to-PCB interface of claim 12, further comprising a solder mask on the lower surface of the PCB, wherein the metallic cylinder forms a capacitive ring that capacitively couples the PCB lower ground plane to the outer conductor through the solder mask.

14. The coaxial-to-PCB interface of claim 11, wherein the metallic cylinder has a height and makes electrical contact with a PCB solder mask below the PCB lower ground plane.

15. The coaxial-to-PCB interface of claim 11, wherein the inner conductor of the coaxial structure passes through the via and extends above the PCB upper ground plane.

16. A method of constructing a coaxial-to-printed circuit board (PCB) interface to couple signals between an electrical conductor trace in a PCB and an inner conductor of a coaxial structure, the coaxial structure having an insulator surrounded by an outer conductor, the method comprising:
inserting a metallic cylinder over the outer conductor of the coaxial structure, the metallic cylinder being configured to at least partially surround the outer conductor and form a capacitive gap between the outer conductor of the coaxial structure and a PCB lower ground plane, the metallic cylinder terminating at a second end flush with a first end of the outer conductor;
positioning the coaxial structure with respect to the PCB so that:
the outer conductor and insulator of the coaxial structure lie below a lower surface of the PCB; and
the inner conductor of the coaxial structure is inserted into a via and extending beyond the first end of the outer conductor from the lower surface of the PCB to an upper surface of the PCB; and
depositing solder in the via to provide an electrically conductive path between the electrical conductor trace of the PCB and the inner conductor of the coaxial structure.

17. The method of claim 16, wherein the positioning further includes causing the metallic cylinder to make contact with a solder mask on the lower surface of the PCB.

18. The method of claim 16, wherein positioning the coaxial structure so that the inner conductor of the coaxial structure is inserted into the via includes inserting the inner conductor of the coaxial structure through an annular ring formed by an end portion of the electrical conductor trace.

19. The method of claim 16, further comprising applying force to the PCB to maintain contact between a solder mask on an under side of the PCB lower ground plane and an upper end of the metallic cylinder.

20. The method of claim 16, further comprising applying force to the PCB to maintain contact between an upper edge of the metallic cylinder and a solder mask on a lower side of the PCB lower ground plane.

* * * * *